US012016151B2

(12) United States Patent
Su et al.

(10) Patent No.: US 12,016,151 B2
(45) Date of Patent: Jun. 18, 2024

(54) CONTROLLING AIRFLOW THROUGH A COMPACT ELECTRONIC DEVICE

(71) Applicant: Plume Design, Inc., Palo Alto, CA (US)

(72) Inventors: Ming-Tsung Su, Taipei (TW); Isaac Wang, Taoyuan (TW); William McFarland, Portola Valley, CA (US)

(73) Assignee: PLUME DESIGN, INC., Palo Alto, CA (US)

( * ) Notice: Subject to any disclaimer, the term of this patent is extended or adjusted under 35 U.S.C. 154(b) by 181 days.

(21) Appl. No.: 17/859,549

(22) Filed: Jul. 7, 2022

(65) Prior Publication Data
US 2024/0015918 A1 Jan. 11, 2024

(51) Int. Cl.
*H05K 7/20* (2006.01)
*H04B 1/036* (2006.01)
*H05K 5/02* (2006.01)
*H04W 88/08* (2009.01)

(52) U.S. Cl.
CPC ......... *H05K 7/20136* (2013.01); *H04B 1/036* (2013.01); *H05K 5/0213* (2013.01); *H04W 88/08* (2013.01)

(58) Field of Classification Search
CPC .. H05K 7/20136; H05K 5/0213; H04W 88/08
See application file for complete search history.

(56) References Cited

U.S. PATENT DOCUMENTS

| 7,315,533 B2 | 1/2008 | Theobold et al. |
| 7,414,978 B2 | 8/2008 | Lun et al. |
| 7,953,403 B2 | 5/2011 | Nientiedt |

(Continued)

FOREIGN PATENT DOCUMENTS

| CN | 205304850 U | 6/2016 |
| CN | 205847310 U | 12/2016 |

OTHER PUBLICATIONS

Jun. 26, 2017 International Search Report for International Application PCT/US2017/023130.

(Continued)

*Primary Examiner* — Mukundbhai G Patel
(74) *Attorney, Agent, or Firm* — Nicholas Martin; Greenberg Traurig, LLP

(57) ABSTRACT

Compact electronic devices, such as Access Points (APs), having airflow and cooling features are provided. According to one implementation, a compact electronic device includes an outer plastic housing and an inner casing arranged inside the outer plastic housing. The inner casing has a high-voltage section configured to support one or more high-voltage electrical components and a low-voltage section configured to support one or more low-voltage electrical components. The compact electronic device further includes a single fan that is configured to draw air from outside the outer plastic housing, move the air through the high-voltage and low-voltage sections, and exhaust the air through one or more exhaust vents in the outer plastic housing. Also, the inner casing is configured to isolate the one or more high-voltage electrical components from metal portions of the low-voltage section by at least a certain separation to meet clearance and creepage safety standards.

20 Claims, 25 Drawing Sheets

(56) References Cited

U.S. PATENT DOCUMENTS

| | | |
|---|---|---|
| 8,798,021 B2 | 8/2014 | Mangalvedhe et al. |
| 8,981,218 B1 | 3/2015 | Kono et al. |
| 9,060,279 B2 | 6/2015 | Ganu et al. |
| 9,066,251 B2 | 6/2015 | Madan et al. |
| 9,131,391 B2 | 9/2015 | Madan et al. |
| 9,131,392 B2 | 9/2015 | Madan et al. |
| 9,420,528 B2 | 8/2016 | Madan et al. |
| 9,497,700 B2 | 11/2016 | Madan et al. |
| 9,510,214 B1 | 11/2016 | Balasubramaniam et al. |
| 9,516,579 B1 | 12/2016 | Diner et al. |
| 2005/0152323 A1 | 7/2005 | Bonnassieux et al. |
| 2006/0258395 A1 | 11/2006 | Cave et al. |
| 2007/0090490 A1 | 4/2007 | Chang et al. |
| 2007/0149172 A1 | 6/2007 | Dickinson |
| 2007/0242621 A1 | 10/2007 | Nandagopalan et al. |
| 2009/0211789 A1 | 8/2009 | Yeates et al. |
| 2009/0257380 A1 | 10/2009 | Meier |
| 2009/0279427 A1 | 11/2009 | Ji et al. |
| 2009/0316585 A1 | 12/2009 | Srinivasan |
| 2009/0323632 A1 | 12/2009 | Nix |
| 2010/0029282 A1 | 2/2010 | Stamoulis et al. |
| 2011/0039554 A1 | 2/2011 | Bims |
| 2011/0119370 A1 | 5/2011 | Huang et al. |
| 2011/0151886 A1 | 6/2011 | Grayson et al. |
| 2012/0002567 A1 | 1/2012 | Sun et al. |
| 2012/0087268 A1 | 4/2012 | Savoor et al. |
| 2012/0122503 A1 | 5/2012 | Ma et al. |
| 2012/0257585 A1 | 10/2012 | Sydor et al. |
| 2013/0201857 A1 | 8/2013 | Bhargava et al. |
| 2013/0272285 A1 | 10/2013 | Goldsmith et al. |
| 2014/0092765 A1 | 4/2014 | Agarwal et al. |
| 2014/0116772 A1 | 5/2014 | Shrum, Jr. et al. |
| 2014/0126410 A1 | 5/2014 | Agarwal et al. |
| 2014/0321325 A1 | 10/2014 | Jing et al. |
| 2014/0328190 A1 | 11/2014 | Martin et al. |
| 2015/0341797 A1 | 11/2015 | Madan et al. |
| 2016/0044447 A1 | 2/2016 | Tetreault et al. |
| 2016/0080949 A1 | 3/2016 | Chandrasekhar et al. |
| 2016/0164725 A1 | 6/2016 | Wu et al. |
| 2017/0272317 A1 | 9/2017 | Singla et al. |
| 2021/0151875 A1* | 5/2021 | Samardzija .............. H01Q 1/48 |

OTHER PUBLICATIONS

Sep. 20, 2019, International Search Report and Written Opinion issued for International Application No. PCT/US2019/034512.

Sep. 27, 2019, International Search Report and Written Opinion issued for International Application No. PCT/US2019/035304.

* cited by examiner

→ AIR INTAKE
----→ AIR EXHAUST

CONTROLLING AIRFLOW THROUGH A COMPACT ELECTRONIC DEVICE

FIELD OF THE DISCLOSURE

The present disclosure generally relates to a wireless networking device. More particularly, the present disclosure relates to systems and methods for cooling a compact electronic device, such as a wireless access device.

BACKGROUND OF THE DISCLOSURE

Wi-Fi networks (i.e., Wireless Local Area Networks (WLAN) based on the IEEE 802.11 standards) have become ubiquitous. People use them in their homes, at work, and in public spaces such as schools, cafes, even parks. Wi-Fi provides great convenience by eliminating wires and allowing for mobility. The applications that consumers run over Wi-Fi is continually expanding. Today people use Wi-Fi to carry all sorts of media, including video traffic, audio traffic, telephone calls, video conferencing, online gaming, and security camera video. Often traditional data services are also simultaneously in use, such as web browsing, file upload/download, disk drive backups, and any number of mobile device applications. In fact, Wi-Fi has become the primary connection between user devices and the Internet in the home or other locations. The vast majority of connected devices use Wi-Fi for their primary network connectivity. As such, Wi-Fi access devices, namely Wi-Fi Access Points (APs) are deployed in a distributed fashion in a location (home, office, etc.).

The trend in consumer electronics design and the like is for aesthetically pleasing hardware form factors in a small and compact manner. For example, a distributed Wi-Fi system includes a number of Wi-Fi APs distributed around a location such as a residence. However, placing a number of APs around a house puts additional pressure on making the APs small, attractive, and without vent holes that are visible and annoying to the consumer (e.g., unique industrial design). Such small APs, with an appealing, compact industrial design, raise significant issues with respect to cooling, airflow, etc.

As with other fields of technology, Wi-Fi has undergone changes and upgrades in recent years. For example, Wi-Fi 5 is being replaced with Wi-Fi 6 (or Wi-Fi 6E), which opens up an additional 6 GHz band and essentially quadruples the number of transmission channels. While Wi-Fi 5 has been capable of operating speeds of 3.5 Gbps, Wi-Fi 6 now enables operation at 9.6 Gbps. However, the benefits of these additional channels and greater speeds also comes with a downside. For example, an AP using Wi-Fi 6 technology obviously requires more power. That is, while a Wi-Fi 5 Access Point (AP) device might use about 15W of power, a Wi-Fi AP device might use 24 W, which naturally results in the generation of a greater amount of heat and could even overheat equipment without proper ventilation. Therefore, there is a need in AP devices to create a fan module (within the same form factor as previous generations) that is able to move air through the AP more efficiently to keep the equipment from overheating, even while operating at higher power levels.

BRIEF SUMMARY OF THE DISCLOSURE

In one embodiment, a wireless Access Point (AP) includes a housing including a plurality of sides each adjacent to a base portion, wherein the base portion houses a plurality of components including a fan module, a Printed Circuit Board (PCB) including one or more Wi-Fi radios, and a power supply. The AP also includes an electrical plug connected to the power supply and extends from the bottom portion for insertion into an electrical outlet for power and for physical support of the AP adjacent to the electrical plug. The AP can further include a plurality of vents disposed about the housing which are hidden from view when the AP is plugged into the electrical plug.

A compact electronic device, according to another embodiments, includes an outer plastic housing and an inner casing arranged inside the outer plastic housing. The inner casing includes a high-voltage section and a low-voltage section, where the high-voltage section is configured to support one or more high-voltage electrical components and the low-voltage section is configured to support one or more low-voltage electrical components. The compact electronic device also includes a single fan configured to draw air from outside the outer plastic housing, move the air through the high-voltage section and low-voltage section, and exhaust the air through one or more exhaust vents in the outer plastic housing. The inner casing is configured to isolate the one or more high-voltage electrical components from metal portions of the low-voltage section by at least a certain separation to meet clearance and creepage safety standards.

Furthermore, the low-voltage section of the compact electronic device described above may be configured to support at least a fan module that includes at least the single fan. The high-voltage section may be configured to support at least a transformer electrically connected to an AC electrical plug, which may be connected to an AC electrical outlet that provides AC power to the compact electronic device and physically keeps the compact electronic device substantially in place when plugged into the AC electrical outlet. The high-voltage section may include a plastic chamber within the inner casing for protecting the one or more high-voltage electrical components from electromagnetic interference. The plastic chamber, for example, may include one or more side windows allowing air to flow from bottom vents in the outer plastic housing, through one or more openings in the inner casing, through the one or more side windows into the plastic chamber, and through an air passage that connects the high-voltage section to the low-voltage section. Each of the one or more side windows may include a lip configured to increase electromagnetic separation between the high-voltage section and the low-voltage section.

In some embodiments, the compact electronic device described above may include additional features that may be beneficial for efficient cooling of electronic components. For example, the low-voltage section may be configured to support at least a PCB and a CPU module mounted on the PCB. The CPU module, according to some embodiments, may include at least a CPU die and a conductive shield. The conductive shield may have an opening in a top portion thereof, where the opening may have dimensions that are larger than the CPU die itself. The opening is configured to allow air to flow into the CPU module and around the CPU die, for cooling purposes. The CPU module may further include a plurality of fingers extending at an angle from the top surface of the conductive shield, where a "spring" end of the fingers may be configured to contact a heat sink that covers the CPU module. Furthermore, the low-voltage section may further include spring clips attached to a top surface of the PCB and the conductive shield may include edges extending downward from the top portion thereof to give the CPU module a low profile. As such, the edges may be supported by the spring clips and may include relatively large side openings therein to allow greater air flow around the CPU die within the CPU module.

According to some embodiments, the compact electronic device described above may also include other airflow-assisting features. For example, the outer plastic housing described above may include a top cover removably attached to a base portion. When the top cover is attached to the base portion, the completed outer plastic housing is configured to form slit vents having a predetermined gap between an underside surface of the top cover and an upper edge of the base portion. The top cover may include a wall that extends downward from the underside surface thereof. The wall may have a height that is greater than the predetermined gap to thereby hide the inner casing (and other interior components) from a viewpoint outside the outer plastic housing. The slit vents, for example, are configured to allow air to flow into an interior of the outer plastic housing. The compact electronic device may further include an insert having a top surface, side surface, and a slanted bottom surface. The top surface of the insert is configured to be attached to the underside surface of the top cover, the side surface is configured to be arranged next to the wall, and the slanted bottom surface is configured to direct air flow away from the wall to reduce turbulence and eddies. This insert is used to enhance airflow, reduce turbulence or eddies, and provide a smooth path for air to flow in a more aerodynamic manner. Certain portions of the insert may also be placed within gaps formed by a plurality of connection elements configured to connect the top cover to the base portion. The insert may be attached to the underside surface of the top cover using two-sided tape. The slit vents may include multiple intake air vents and one exhaust air vent, where the bottom section may include one or more intake air vents.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

The present disclosure relates to systems and methods for cooling a compact electronic device, such as a wireless access device. The compact electronic device can be a Wi-Fi Access Point (AP) or the like in a distributed Wi-Fi system. Physical features of the compact electronic device include a small form-factor with multiple sides, direct plug into an electrical outlet, internal power supply and fan, etc. To address the unique form-factor, the compact electronic device includes a unique form factor and layout for air flow, an air gap structure to use the same openings for air intake and exhaust, a layered structure for guiding air between layers, a fan located in an interior of the device, and the like. The design of the compact electronic device provides efficient cooling due to multiple air intake locations, quiet operation with the fan module disposed in the interior, long life, low cost, and compact size.

Referring to FIGS. 1-11, various diagrams include a compact electronic device 10 for illustration purposes. In an embodiment, the compact electronic device 10 is a wireless Access Point (AP), wireless access device, or equivalent. The compact electronic device 10 has a compact form-factor that is configured to directly plug into an electrical outlet. Accordingly, the form-factor is limited in size to ensure the compact electronic device 10 does not obstruct other electrical outlets and so that the weight of the compact electronic device 10 can be support by the electrical outlet and the plug. While illustrated as a wireless access device, those skilled in the art will recognize the systems and methods described herein can apply to any type of compact electronic device, including sensors, cameras, Internet of Things (IoT) devices, media playing devices, personal assistants, etc.

Figure 1:
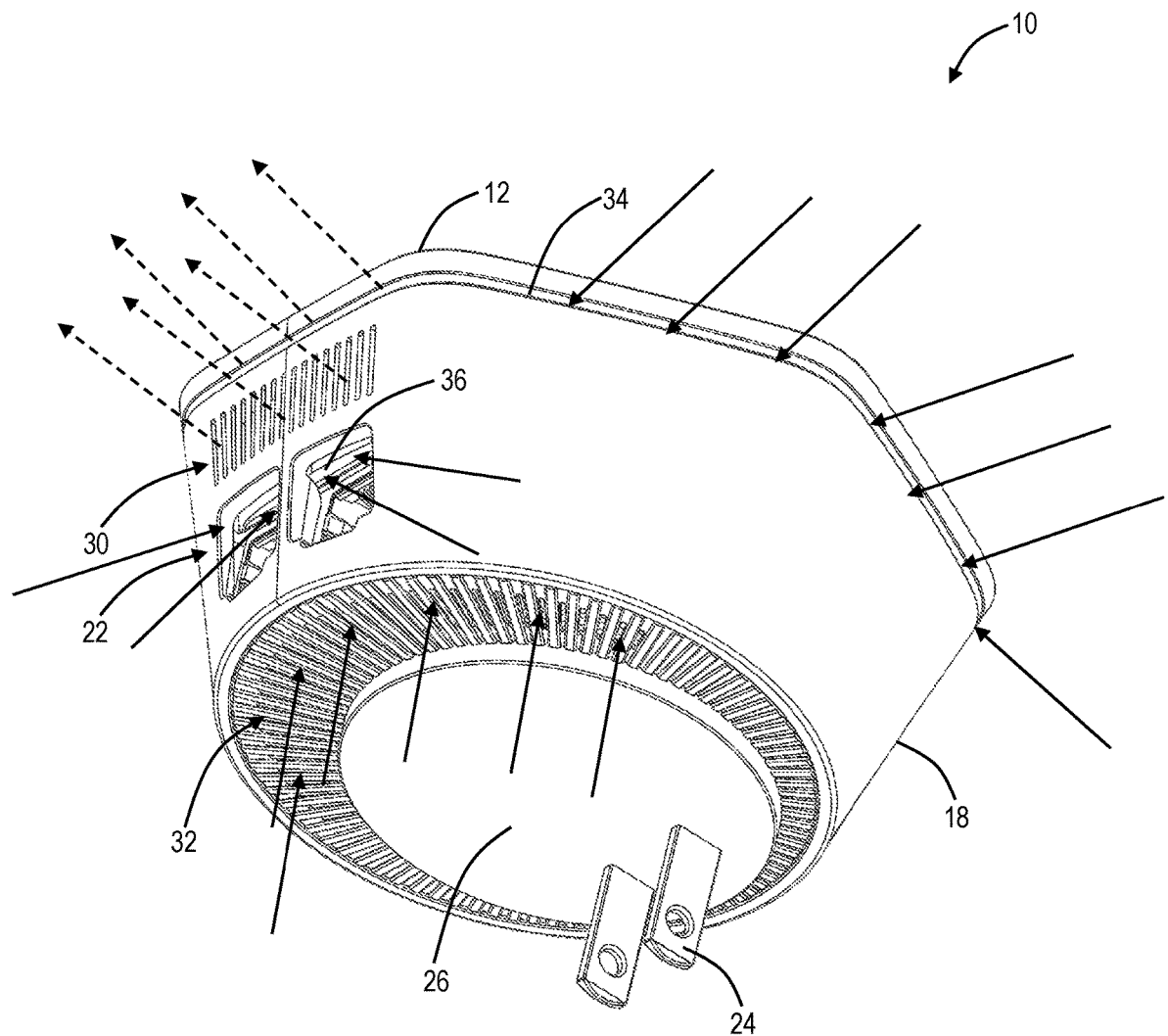
FIG. 1 is a perspective diagram of a compact electronic device.
Figure 2:
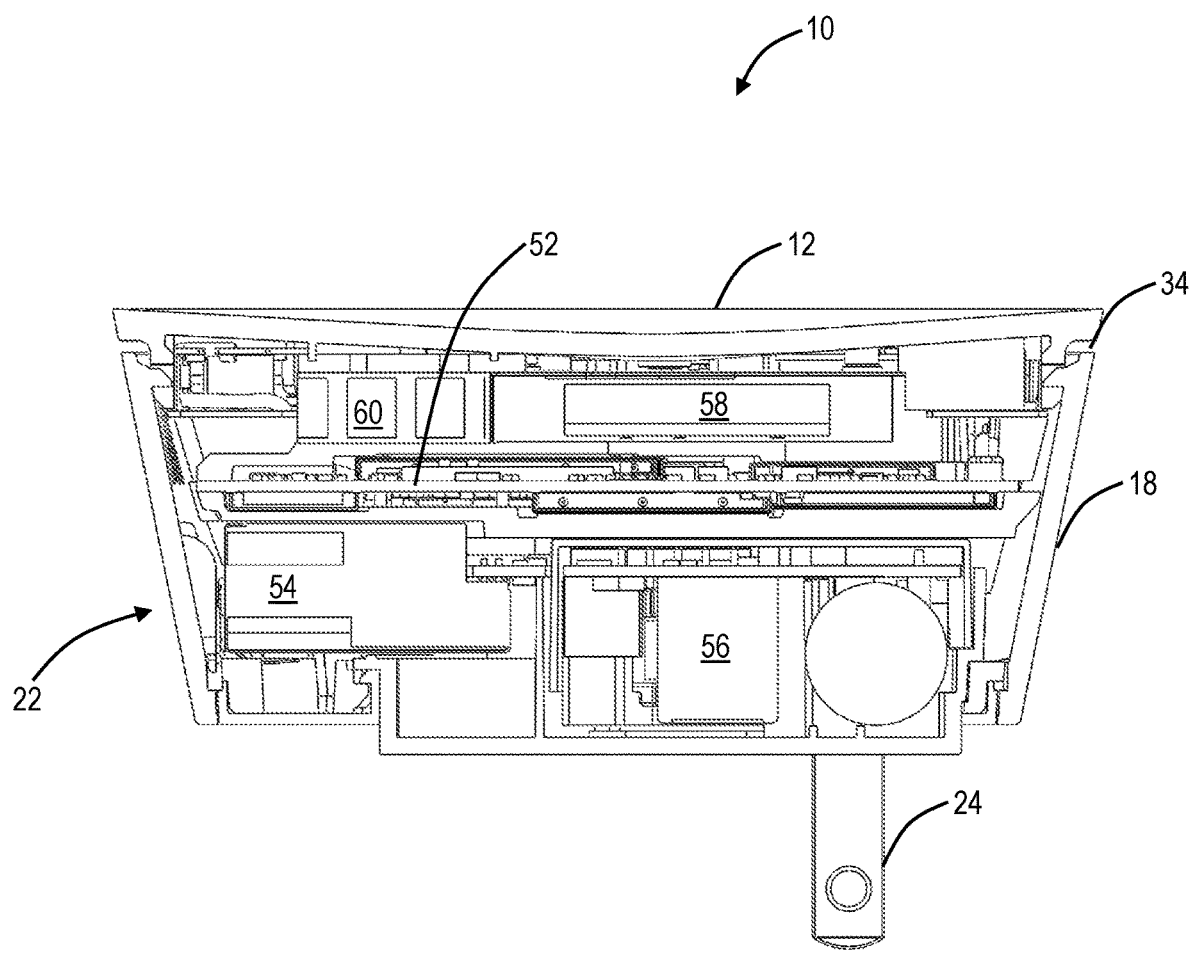
FIG. 2 is a cross-sectional diagram of the compact electronic device from the side.
Figure 3:
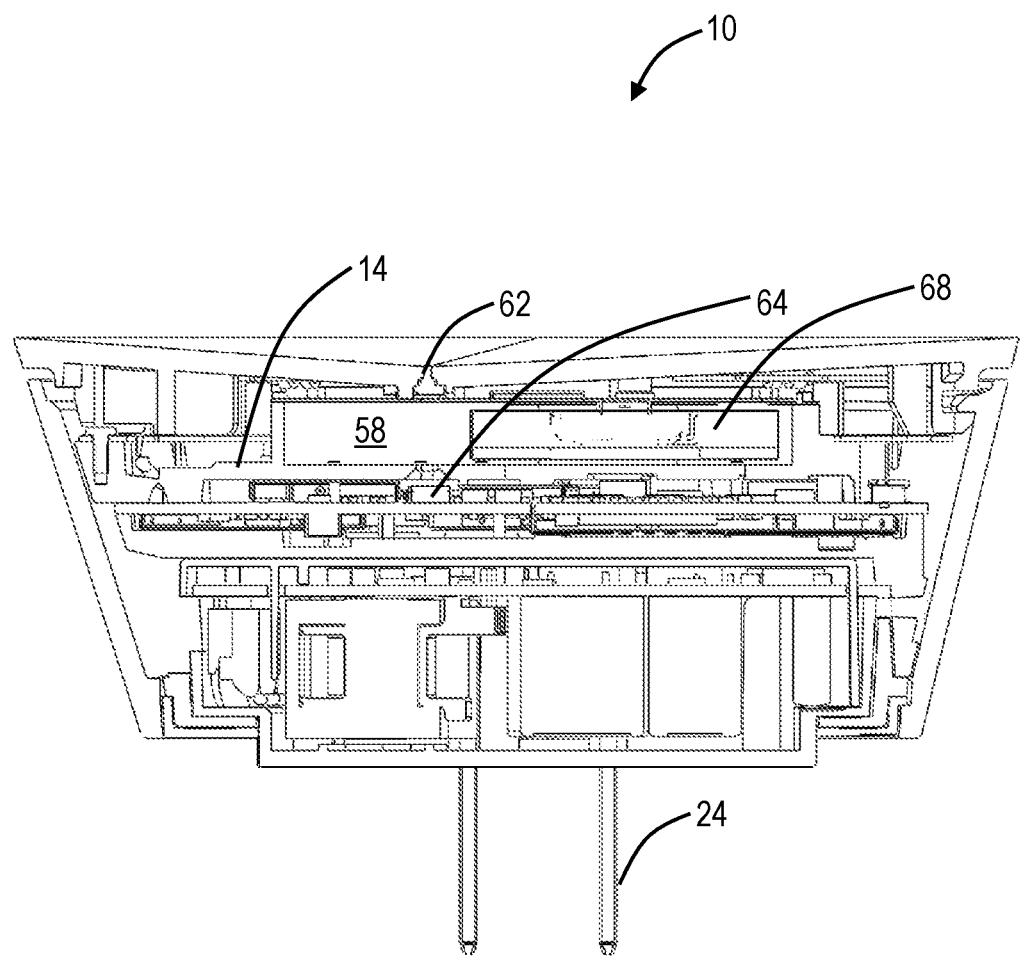
FIG. 3 is another cross-sectional diagram of the compact electronic device from the top.
Figure 4:
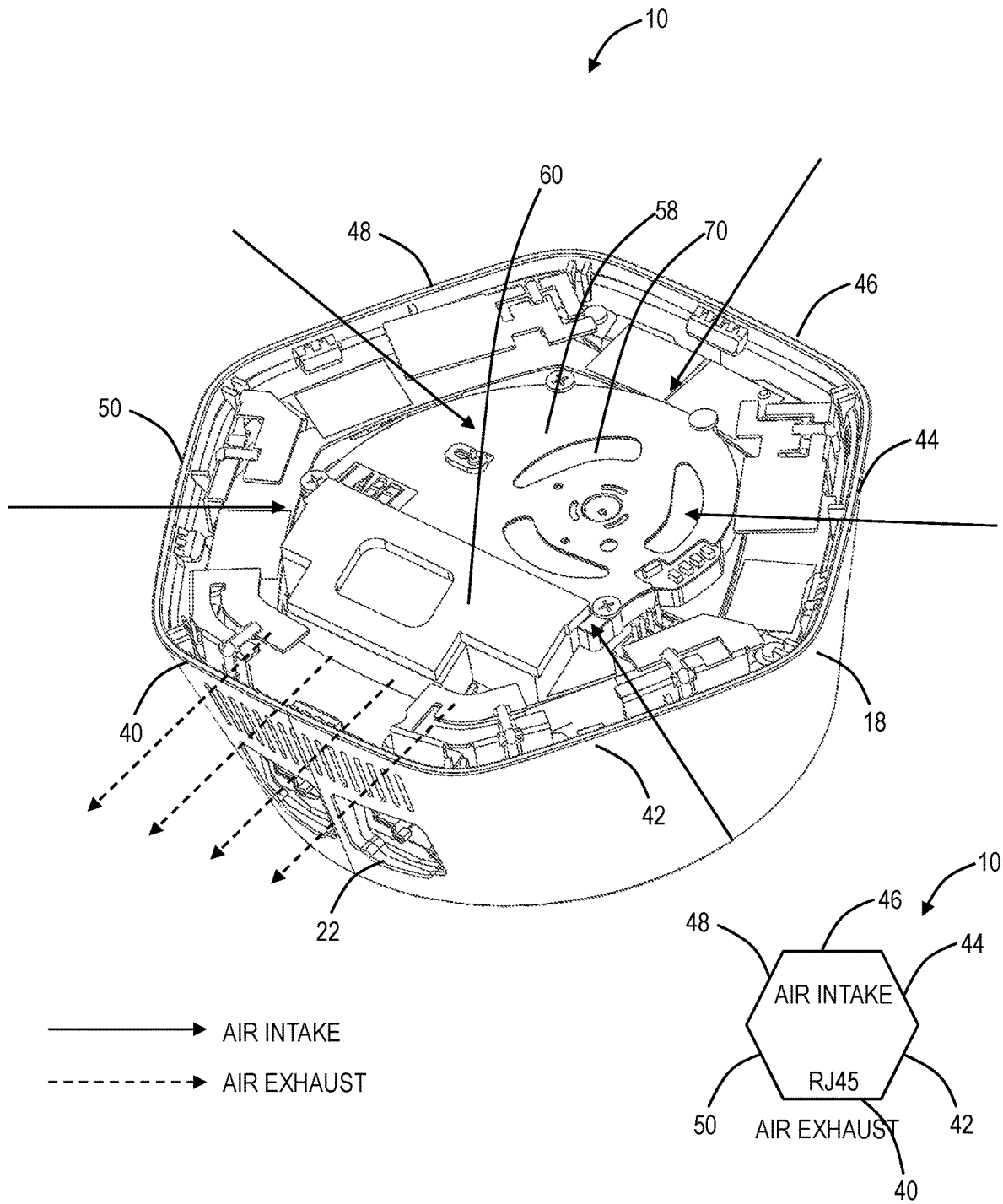
FIG. 4 is a perspective diagram of the compact electronic device with a top cover removed.
Figure 5:
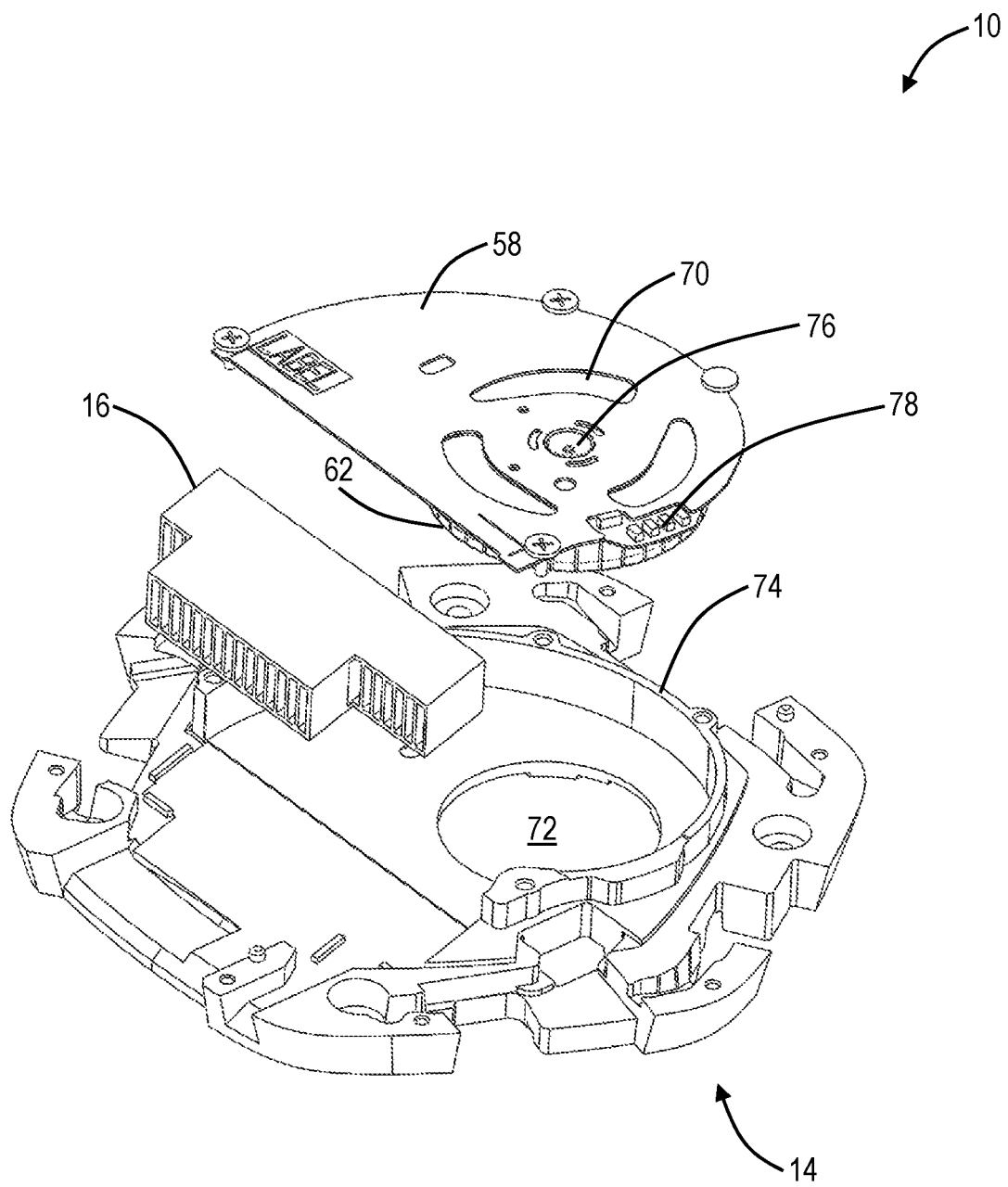
FIG. 5 is a perspective diagram of a heatsink and fan module for the compact electronic device.
Figure 6:
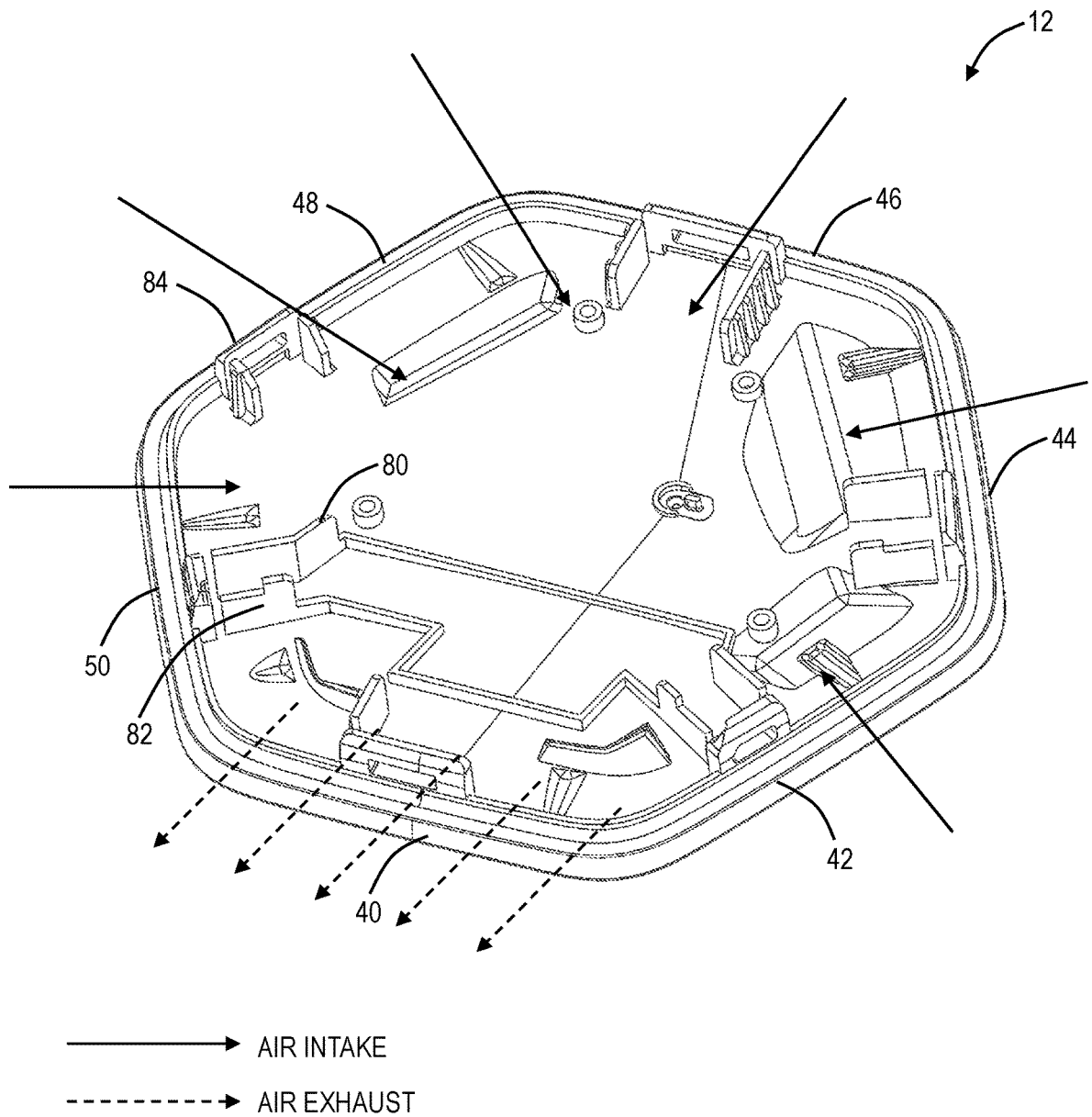
FIG. 6 is a perspective diagram of the interior portion of the top cover.
Figure 7:
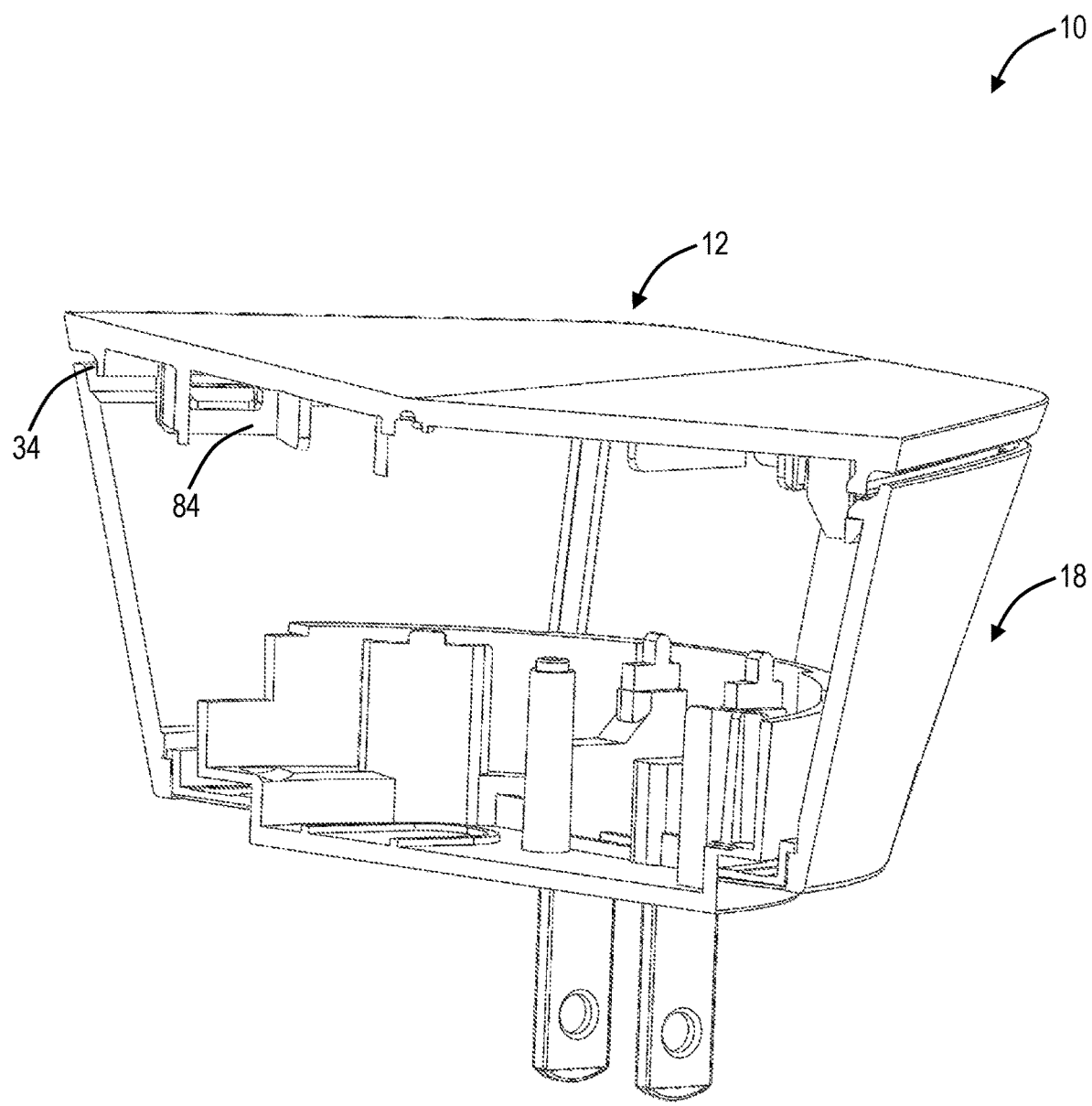
FIG. 7 is a cross-sectional diagram of the compact electronic device illustrating connectivity between the top cover and a base.
Figure 8:
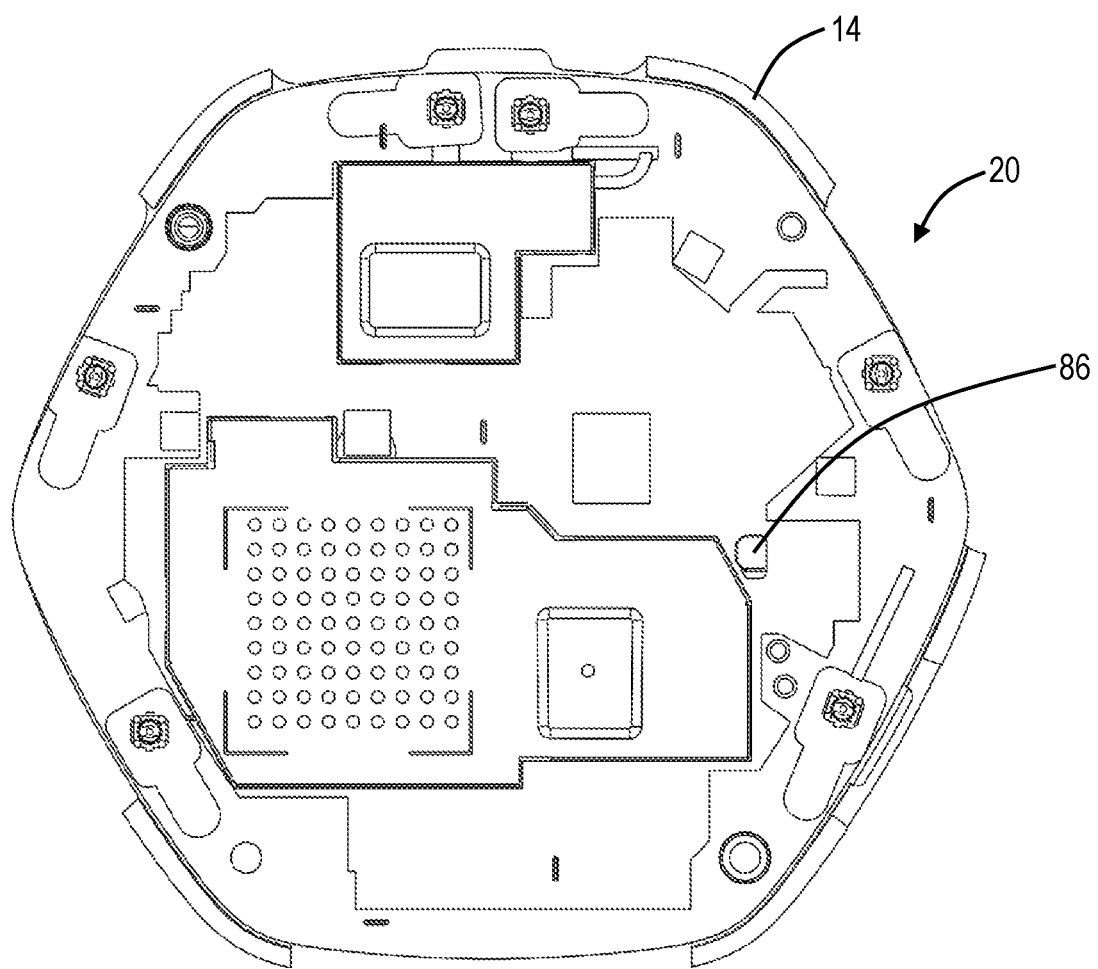
FIG. 8 is a bottom diagram of a Printed Circuit Board (PCB) in the compact electronic device and associated gaps for airflow.
Figure 9:
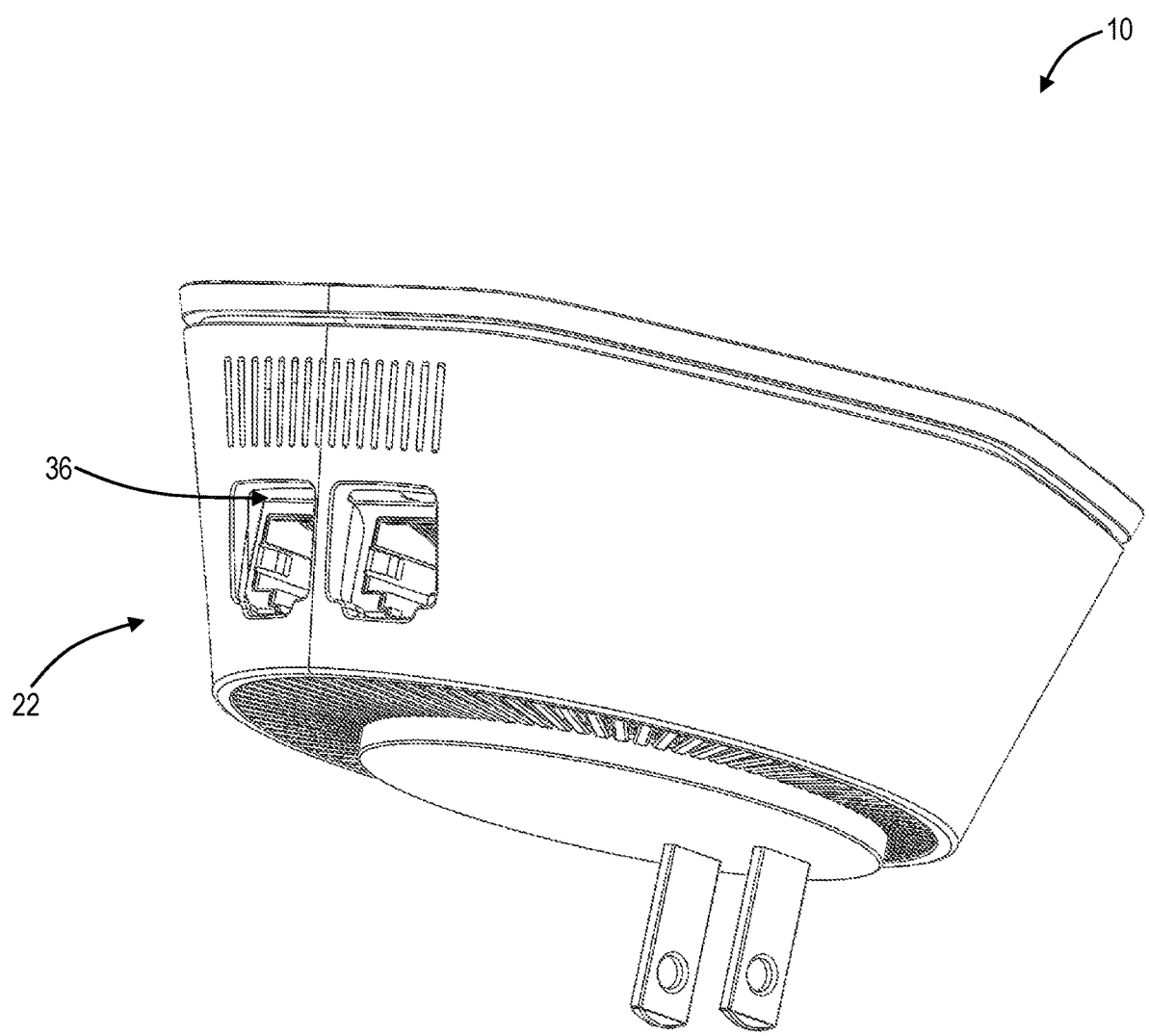
FIG. 9 is a perspective diagram of the compact electronic device illustrating RJ-45 ports used in part for airflow.
Figure 10:
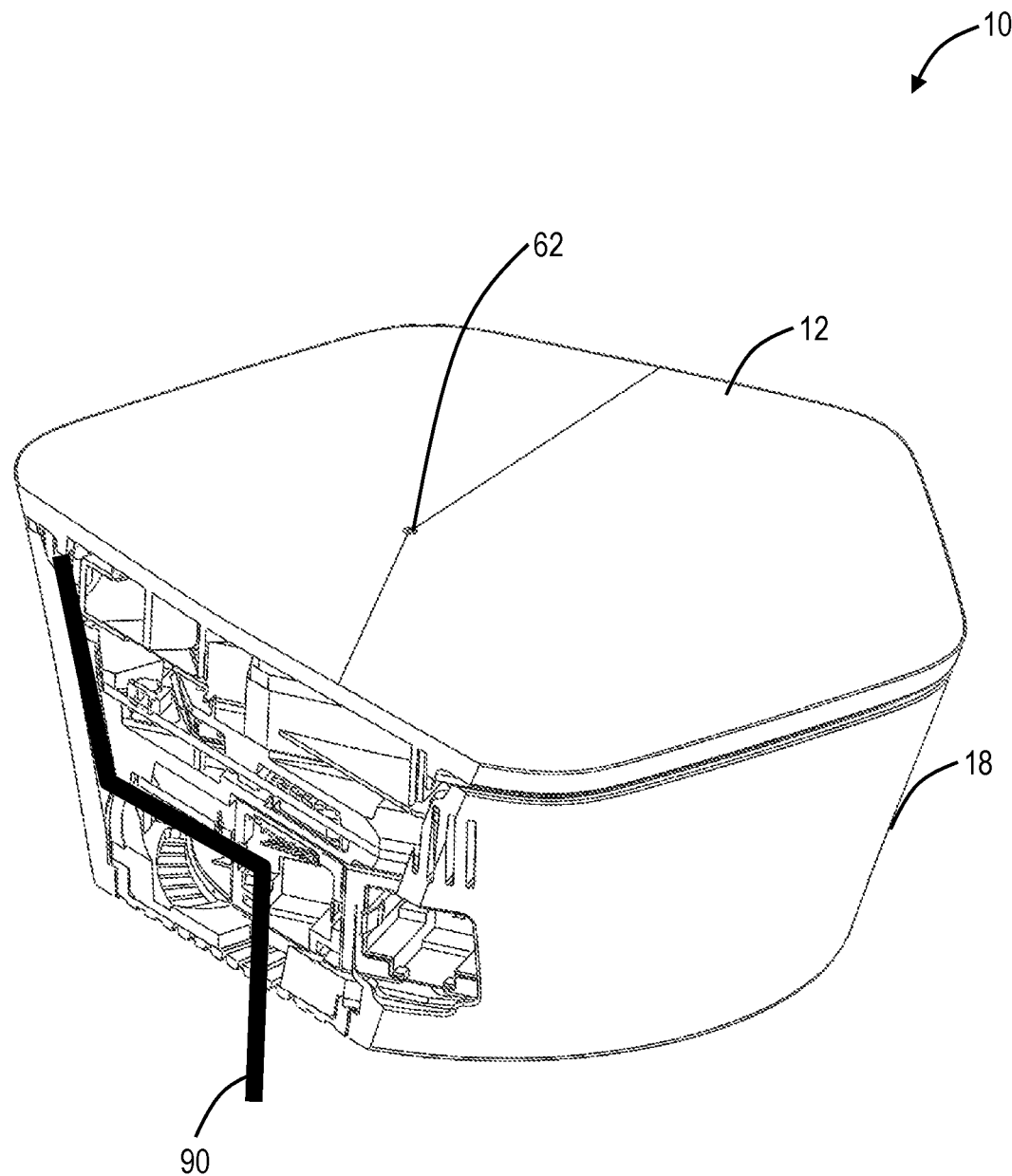
FIG. 10 is a cross-sectional diagram of the compact electronic device illustrating overall airflow.
Figure 11:
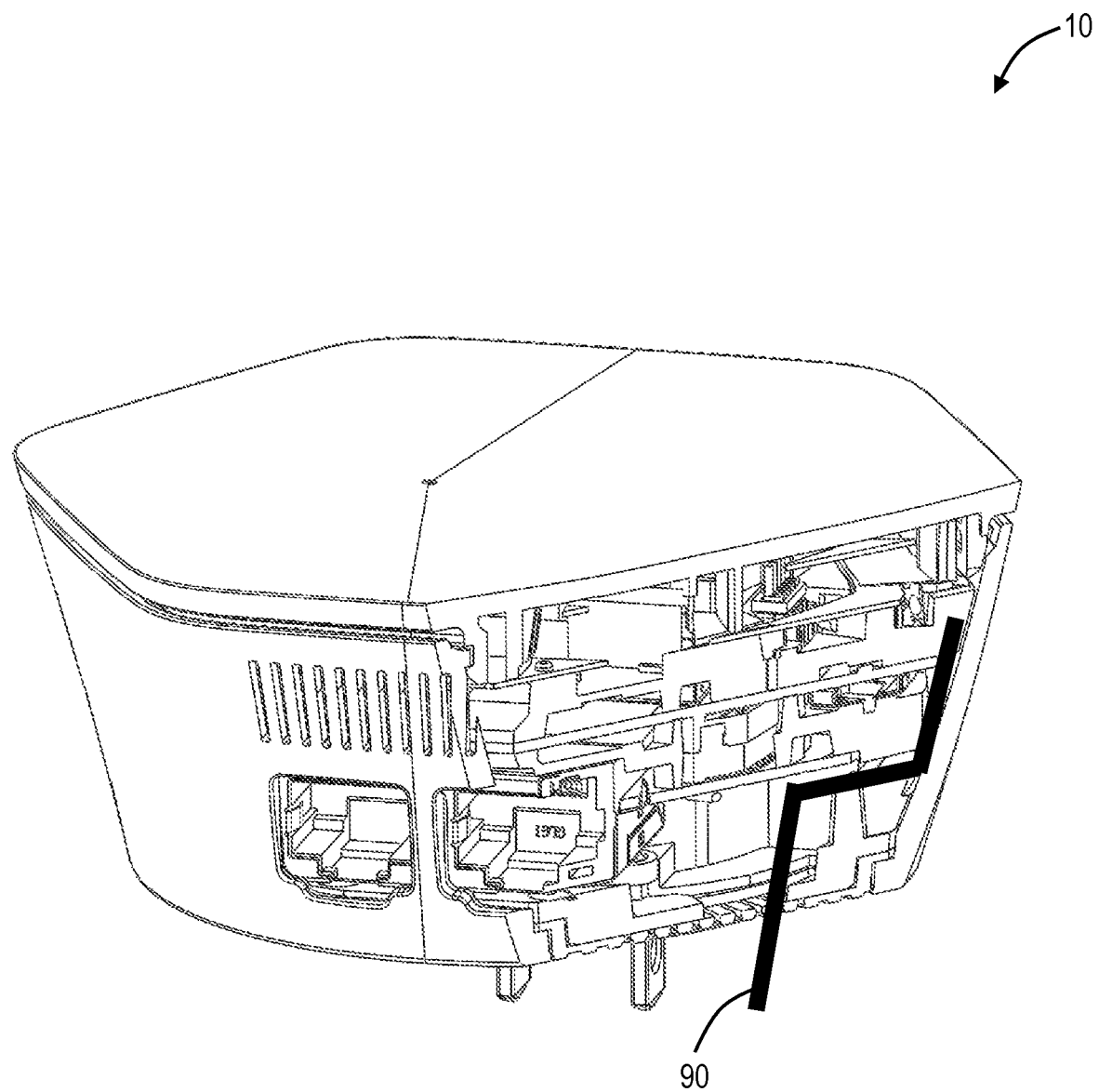
FIG. 11 is a different cross-sectional diagram of the compact electronic device illustrating overall airflow.

FIG. 1 is a perspective diagram of a compact electronic device 10. FIG. 2 is a cross-sectional diagram of the compact electronic device 10 from the side. FIG. 3 is another cross-sectional diagram of the compact electronic device 10 from the top. FIG. 4 is a perspective diagram of the compact electronic device 10 with a top cover 12 removed. FIG. 5 is a perspective diagram of a heatsink 14 and fan module for the compact electronic device 10. FIG. 6 is a perspective diagram of the interior portion of the top cover 12. FIG. 7 is a cross-sectional diagram of the compact electronic device 10 illustrating connectivity between the top cover 12 and a base 18. FIG. 8 is a bottom diagram of a Printed Circuit Board (PCB) 20 in the compact electronic device 10 and associated gaps for airflow. FIG. 9 is a perspective diagram of the compact electronic device 10 illustrating RJ-45 ports 22 (cable connector ports) used in part for airflow. FIG. 10 is a cross-sectional diagram of the compact electronic device 10 illustrating overall airflow. FIG. 11 is a different cross-sectional diagram of the compact electronic device illustrating overall airflow.

In FIG. 1, the compact electronic device 10 includes the top cover 12 over the base 18 and an electrical plug 24 protruding from a bottom portion 26 of the base 18. The base 18 includes RJ-45 ports 22 which enable data connectivity to the compact electronic device 10, e.g., via Ethernet cables. The base 18 can include other types of wired ports which are omitted for illustration purposes. The base 18 can also include various openings for air intake and/or exhaust including vents 30 located on a side of the base 18, vents 32 located on the bottom portion 26, an air gap 34 at a lid between the top cover 12 and the base 18, and an air gap 36 in the RJ-45 ports.

Of note, all of the openings (the vents 30, the vents 32, the air gap 34, and the air gap 36) are hidden when the compact electronic device 10 is plugged into an electrical outlet. By hidden, the openings are not easily observed by a person looking at the compact electronic device 10. Further, having multiple openings for air intake (the vents the air gap 34 on the sides 42-50, and the air gap 36) allows fresher, cooler air to come to the components near the respective vents.

The electrical plug 24 provides two functions, namely, to connect electrically to a corresponding electrical outlet and to mechanically support the weight of the compact electronic device 10 while plugged into the electrical outlet. Thus, the bottom portion 26 will be disposed adjacent to a corresponding structure (e.g., wall) which has the electrical outlet (not shown). Accordingly, the vents 32 are recessed from the back 26 to allow a gap between the vents and the wall sufficient for airflow.

The base 18 can include a plurality of sides 40, 42, 44, 46, 48, 50. This is illustrated in FIG. 1 in a logical diagram. In an embodiment, the base 18 can have a hexagonal design, i.e., 6 sides. Of course, other embodiments are contemplated. The compact electronic device 10 uses different sides for air intake. FIG. 1 illustrates air flow in the compact electronic device 10 with air intake (cold or room temperature air) shown in solid lines and air exhaust (warm air) shown in dotted lines.

In an embodiment, the vents 30 and the air gap 34 on the side 40 are used for hot air exhaust while the vents 32, the air gap 34 on the other sides 42, 44, 46, 48, 50, and the air gap 36 are used for cold air intake. That is the air gap 34 are configured to segment between air intake and air exhaust based on the side 40-50. Additional details of the airflow within the compact electronic device 10 are described herein.

The top cover 12 can be snapped on the base 18 and can include the air gap 34 which is between the top cover 12 and the base 18. The air gap 34 is around on each side 40-50 and appears decorative or structural, i.e., not like a vent, and is hidden. The top cover 12 has structural elements which divide the air intake and air exhaust and the structural elements are double walled for improved isolation and to provide more resistance to air leaking from one side to the other and to provide a thermally isolating region between intake (cool air) and exhaust (hot air). There can be a division in the air gap 34 between the side 40 and the sides 42, 50 to separate air intake from air exhaust.

In FIG. 2, the compact electronic device 10 is illustrated in a cross-section to show internal components. The top cover 12 can snap in place with the base 18, such as via a tongue and groove snap. Internally, the compact electronic device 10 includes a PCB 20, an RJ45 port 54, a power supply 56, a fan module 58, and a fan fins module 60. The PCB 20 can include various electronic components which generate heat, such as Wi-Fi chipsets. The RJ45 port 54 includes connectivity for the RJ45 port 22 including an opening for a cable connector. The power supply 56 provides power to all of the components and is connected to the electrical plug 24.

Again, in an embodiment, the compact electronic device 10 is a Wi-Fi access point. Advantageously, this embodiment includes the Wi-Fi access point directly plugging into the electrical outlet in combination with an internal fan and internal power supply.

In FIG. 3, the compact electronic device 10 is illustrated in a cross-section to show a Light Emitting Diode (LED) light guide 62 for an LED 64 disposed on the PCB 20. There is a heatsink 14 which physically supports the fan module 58. The heatsink 14 is disposed above the PCB 20. There is an empty cavity inside of the fan module 58 and the heatsink 14 allowing the LED 64 to shine through without interference. The fan module 58 includes fan blades 68 which do not interfere with the LED 64. The light guide or light pipe above the LED guides the light from the LED to the hole in the lid so that the light is visible. In addition, the light pipe, often a tubular piece of clear plastic, also seals the hole in the housing, preventing cooling air from escaping from the hole.

In FIG. 4, the top cover 12 is removed for illustration. Again, solid line arrows illustrate air intake through the air gap 34 and dotted line arrows illustrate air exhaust through the air gap 34. The fan module 58 is configured to draw air for the air intake into gaps 70 between a middle enclosure and the top cover 12 and to blow the air exhaust via the fan fins module 60. The cool air circulated from the fan module 58 passes through the fan fins module 60 and out the exhaust.

In FIG. 5, the heatsink 14 is illustrated with the fan module 58 and the fan fins module 60 illustrated separately. The heatsink 14 is also a heatspreader and FIG. 5 includes three assemblies/components—the heatsink 14, the fan module 58, and the fan fins module 60. The heatsink 14 sits above the PCB 20 and includes an opening 72 which allows air to the PCB 20 and a wall 74 for supporting the fan module 58. There is cost savings by having the wall 74 integral to the heatsink 14 (molded in the same step) as part of the fan shroud.

The fan module 58 includes the fan blades 68 which are driven by a fan motor 76, the openings 70 for airflow, and a fan PCB 78 for control of the fan module 58. The fan module 58 can be physically attached to the heatsink 14, such as via screws. The fan PCB 78 can be factory tuned for the fan speed to make all devices 10 have the same sound, and cooling behavior (fans as delivered from the manufacturer have varying speed even when operating at the same voltage). The fan PCB 78 can also include a temperature monitor which monitors device 10 temperature and can provide this data periodically to a controller for adjustments. Further, the fan speed of the fan module 58 can be adjusted to maximize life, minimize noise, reduce power, etc. based on the monitored temperature. For example, the device 10 can be plugged in a residence, such as in a bedroom, living room, etc. It is important that the fan module 58 does not cause too much ambient noise. To that end, the tuning can be to set the speed to avoid noise above a certain threshold.

The fan fins module 60 includes directive fins for channeling air exhaust from the fan module 58 out the air exhaust openings, i.e., the air gap 34 on the side 40 and the vents 30. The fan fins module 60 can be physically attached to the heatsink 14, such as directly soldered. Note, the fan fins module 60 can be part of the heatsink 14, but soldered down to provide excellent thermal contact to the heatsink 14. The cost of the entire assembly can be reduced by having the fins constructed separately from the fan module and attached, preferably by soldering to provide the best thermal conduction. The fins are designed to align the direction of the air exhaust, out the vents 30 and the air gap 34 on the side 40, specifically spaced to optimize airflow and cooling.

Note, the fan module 58 is disposed in the middle of the compact electronic device 10 to minimize noise while operation and further is away from both the air intake openings (the vents 32, the air gap 34 in the sides 42-50, and the air gap 36) and the air exhaust openings (the vents 30 and the air gap 34 in the side 40). This configuration ensures airflow through the compact electronic device 10.

In FIG. 6, the interior side of the top cover 12 is illustrated. Again, solid line arrows illustrate air intake through the air gap 34 and dotted line arrows illustrate air exhaust through the air gap 34. Specifically, FIG. 6 illustrates the structural elements in the top cover 12 which divide the air intake and air exhaust. The top cover 12 includes divider walls 80, 82 for a double wall configuration to improve isolation between the air intake and the air exhaust. The divider walls 80 separate the air exhaust on the side 40 from the air intake on the sides 42-50. This ensures that the cool air intake does not mix with the hot air exhaust for maximum cooling efficiency.

In FIG. 7, a cross-sectional diagram illustrates the top cover 12 connected to the base 18 with the other components omitted for illustration purposes. FIG. 7 illustrates the connectivity between the top cover 12 and the base 18 and the formation of the air gap 34. The top cover 12 includes one or more extension 84 on each side which can snap to corresponding grooves in the base 18. The air gap 34 is formed since the top cover 12 is not sealed to the base 18, i.e., the physical connectivity between the top cover 12 and the base 18 is via the extension 84.

In FIG. 8, the PCB 20 is illustrated from the bottom, i.e., the heatsink 14 is above the PCB 20 logically in FIG. 8. The PCB 20 includes an opening 86 (and there is a corresponding opening in the heatsink 14). The opening 86 allows airflow from below to pass through the PCB 20.

In FIG. 9, the air gap 36 in the RJ-45 ports 22 is illustrated. Specifically, the air gap 36 is formed to allow airflow out the RJ-45 ports 22.

In FIGS. 10 and 11, cross-sectional diagrams illustrate a "Z" airflow from the vents 30 through the compact electronic device 10. Airflow is illustrated with solid lines 90. The air flows from the vents 30 (vents) on the bottom portion 26 bringing some heat away from the PCB 20 and flowing out of the opening 86 meeting cool air coming in from the air gap 34 and circulating through the fan module 58.

Note, the air gap 34 can also function as a slot antenna which has an opening. The air can flow through the slot antenna as well as the gaps in the heat sinks. Air is guided from layer to layer via gaps in the edges of the heat sinks. One of the air guides is the air gap 34. The air flow follows a "Z" pattern as indicated in FIGS. 10 and 11. The configuration guides air through hottest portion of the design last.

Figure 12:
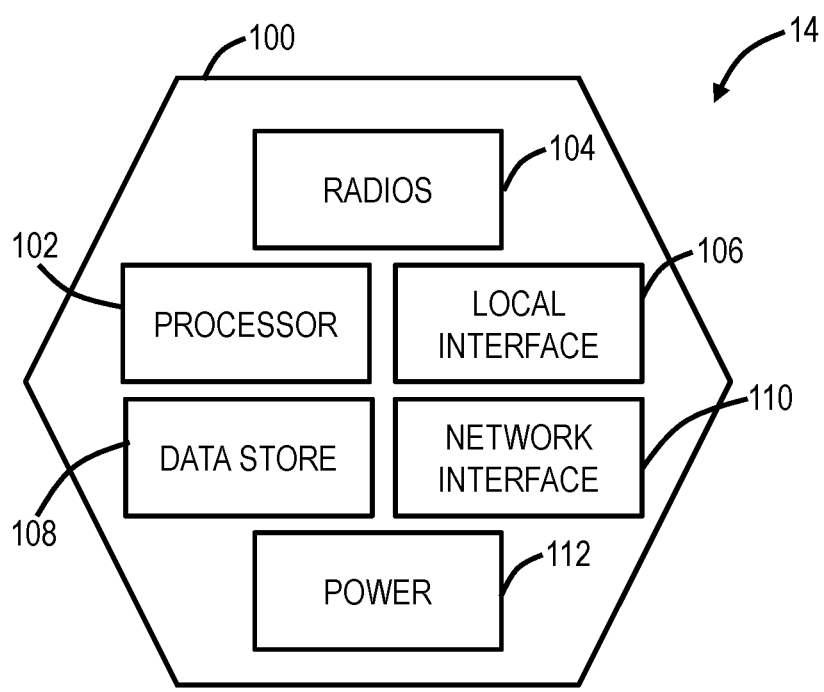
FIG. 12 is a block diagram of functional components of the compact electronic device configured as a wireless access point.

FIG. 12 is a block diagram of functional components of the compact electronic device 10 configured as a wireless access point. The access point includes a physical form factor 100 as described herein which contains a processor 102, a plurality of radios 104, a local interface 106, a data store 108, a network interface 110, and power 112. It should be appreciated by those of ordinary skill in the art that FIG. 12 depicts the access point in an oversimplified manner, and a practical embodiment may include additional components and suitably configured processing logic to support features described herein or known or conventional operating features that are not described in detail herein.

In an embodiment, the form factor 100 is a compact physical implementation where the access point directly plugs into an electrical outlet and is physically supported by the electrical plug connected to the electrical outlet. This compact physical implementation is ideal for a large number of access points distributed throughout a residence. The processor 102 is a hardware device for executing software instructions. The processor 102 can be any custom made or commercially available processor, a central processing unit (CPU), an auxiliary processor among several processors, a semiconductor-based microprocessor (in the form of a microchip or chip set), or generally any device for executing software instructions. When the access point is in operation, the processor 102 is configured to execute software stored within memory or the data store 108, to communicate data to and from the memory or the data store 108, and to generally control operations of the access point pursuant to the software instructions. In an embodiment, the processor 102 may include a mobile-optimized processor such as optimized for power consumption and mobile applications.

The radios 104 enable wireless communication. The radios 104 can operate according to the IEEE 802.11 standard. The radios 104 include address, control, and/or data connections to enable appropriate communications on a Wi-Fi system. The access point can include a plurality of radios to support different links, i.e., backhaul links and client links. In an embodiment, the access points support dual-band operation simultaneously operating 2.4 GHz and 5 GHz 2×2 MIMO 802.11b/g/n/ac radios having operating bandwidths of 20/40 MHz for 2.4 GHz and 20/40/80 MHz for 5 GHz. For example, the access points can support IEEE 802.11AC1200 gigabit Wi-Fi (300+867 Mbps).

The local interface 106 is configured for local communication to the access point and can be either a wired connection or wireless connection such as Bluetooth or the like. The data store 108 is used to store data. The data store 108 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 may incorporate electronic, magnetic, optical, and/or other types of storage media.

The network interface 110 provides wired connectivity to the access point. For example, the network interface 110 can include the RJ-45 ports 22. The network interface 110 may be used to enable the access point to communicate to a modem/router. Also, the network interface 110 can be used to provide local connectivity to a Wi-Fi client device. For example, wiring in a device to an access point can provide network access to a device which does not support Wi-Fi. The network interface 110 may include, for example, an Ethernet card or adapter (e.g., 10BaseT, Fast Ethernet, Gigabit Ethernet, 10GbE). The network interface 110 may include address, control, and/or data connections to enable appropriate communications on the network.

The processor 102 and the data store 108 can include software and/or firmware which essentially controls the operation of the access point, data gathering and measurement control, data management, memory management, and communication and control interfaces with a server via the cloud. The processor 102 and the data store 108 may be configured to implement the various processes, algorithms, methods, techniques, etc. described herein. For example, the processor 102 can be communicatively coupled to the fan PCB 78.

In an embodiment, a compact electronic device includes a base including a plurality of sides each adjacent to a bottom portion, wherein the base houses a plurality of components including a heatsink supporting a fan module located in an interior portion, a Printed Circuit Board (PCB), and a power supply, and wherein vents are disposed on the bottom portion and side vents are disposed on one or more of the plurality of sides, such that the vents are not visible to a normal observer when the device is plugged into the electrical outlet; a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and an electrical plug connected to the power supply and extending out of the bottom portion for insertion into an electrical outlet for power and to physically support the compact electronic device. The compact electronic device can include a Wireless Access Point.

The top cover can include extensions which snap in place to respective sides on the base. The top cover can include a double wall which divides airflow between the air exhaust on the one or more side and the air intake on the remaining sides, the double wall including two substantially shaped walls spaced apart and formed in the top cover. The air intake from the vents can be guided between layers of the plurality of components via gaps in edges of the heat sink. The air intake from the vents can be a Z-shaped flow through the base. The air gap can further operate as a slot antenna. The compact electronic device can further include one or more cable connector ports each with a second air gap for the air intake. The fan module can be disposed adjacent to fins attached to the heatsink, wherein the fins direct the air exhaust. The PCB can include an opening for airflow from the vents to the fan module located above the PCB.

In a further embodiment, a method of providing a compact electronic device includes providing a base including a plurality of sides each adjacent to a bottom portion, wherein the base houses a plurality of components including a heatsink supporting a fan module located in an interior portion, a Printed Circuit Board (PCB), and a power supply, and wherein vents are disposed on the bottom portion and side vents are disposed on one or more of the plurality of sides; providing a top cover configured to attach to the base via the plurality of sides forming an air gap extending each of the plurality of sides, wherein the air gap supports air exhaust on one or more sides of the plurality of sides and air intake on the remaining sides of the plurality of one or more sides; and providing an electrical plug connected to the power supply and extending out of the bottom portion for insertion into an electrical outlet for power and to physically support the compact electronic device.

According to additional embodiments of the present disclosure, the compact electronic device 10 may be altered slightly and/or include additional or alternative features with respect to the embodiments described above. The features described below with respect to FIGS. 13A-23 are configured, in particular, to enable air to flow more efficiently through the interior of the compact electronic device 10 or other similar compact electronic devices (e.g., AP devices) and/or provide better cooling effects to the internal electronic components. The airflow-assisting and cooling features described with respect to FIGS. 13-23 are generally configured to be included in any type of compact electronic devices, such as the compact electronic device 10. For simplicity, the airflow-assisting features and cooling features are described with respect to the compact electronic device 10. However, it should be understood that these features may also be applied to other electronic device having a relatively small form factor.

The terms "top," "bottom," "right," "left," "front," and "back" are used through the present disclosure to describe relative sides of the compact electronic device 10. However, it should be understood that these sides may be changed based on how the compact electronic device 10 is positioned. For example, the term "top" is used to describe one side of the compact electronic device 10 as it is shown in FIG. 1. However, it may be noted that when the compact electronic device 10 is plugged into a wall outlet, the top side (e.g., top cover 12) will be oriented facing away from the wall and may be referred to in this orientation as a "front" cover. Nevertheless, to simplify the discussion of the various embodiments, the relative sides are based on the orientation as shown in FIG. 1, where the top cover 12 is on the top, the bottom portion 26 is on the bottom, the vents 30 are on the front, the right sides 42, 44 of the base 18 (FIG. 4) are visible in FIG. 1, the left sides 48, 50 of the base 18 are hidden from view in FIG. 1, and a back side 46 of the base 18 is also hidden.

According to the various embodiments of the present disclosure, air can be pulled in from the bottom of the compact electronic device 10, pass through a high-voltage AC portion, and then pass through a portal to a low-voltage portion. In some cases, it may be important to isolate the high-voltage AC portion from the low-voltage portion, such as to prevent creepage from the high-voltage portion to the low-voltage portion. The embodiments described herein are able to keep proper isolation (e.g., to meet clearance and creepage standards), while, at the same time, allowing air to flow efficiently through the compact electronic device 10.

In particular, using the same (or similar) form factor for the compact electronic device 10 compared with previous generations, certain modifications can be made to allow the single fan module to operate at the same speed while also providing better cooling effects for the electronics. The single fan can efficiently move air through both the high-voltage and low-voltage sections by drawing air from outside the device to cool both sections. Also, metal components between the high-voltage and low-voltage sections can be separated from the high-voltage AC components (e.g., transformer primary side components) to meet the creepage requirements.

Figure 13A:
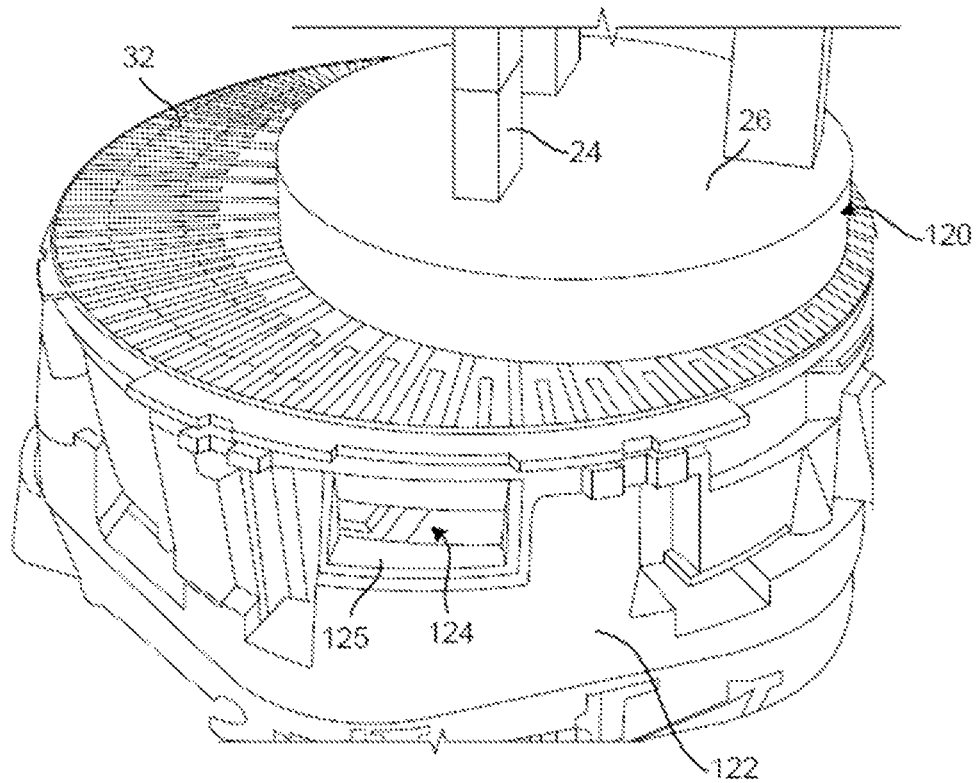
FIGS. 13A-13C are diagrams showing various perspective views of a plastic chamber inside an inner casing.
Figure 13B:
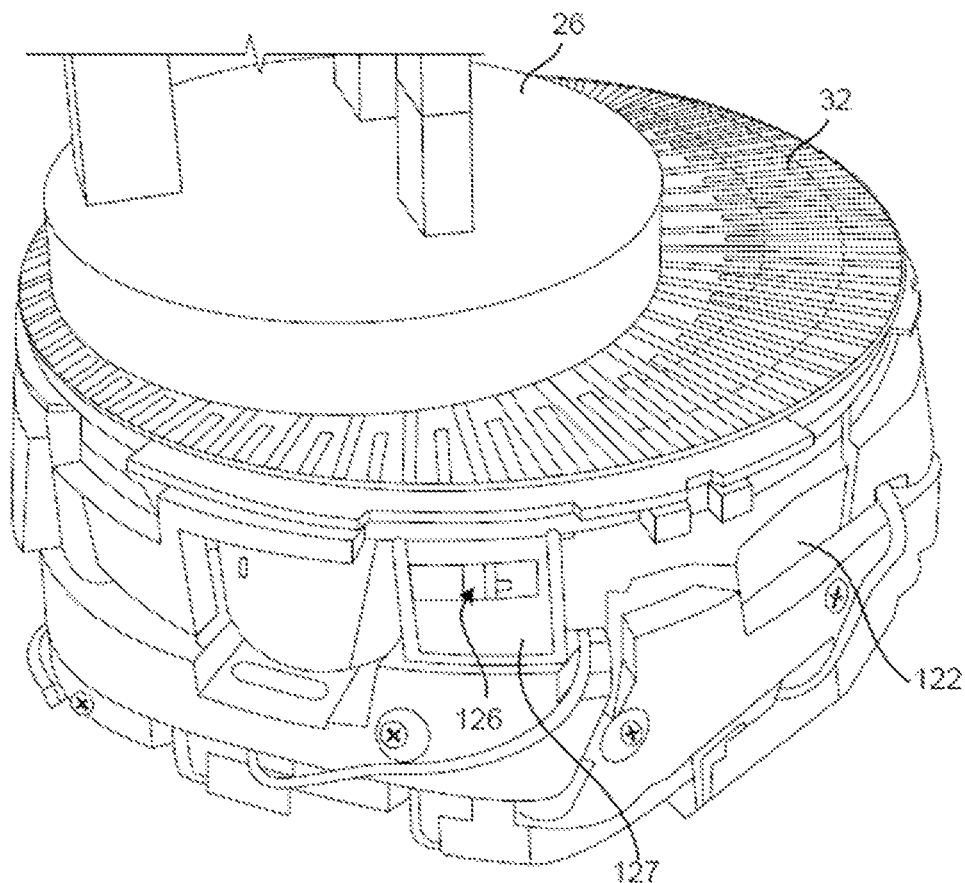
Figure 13C:
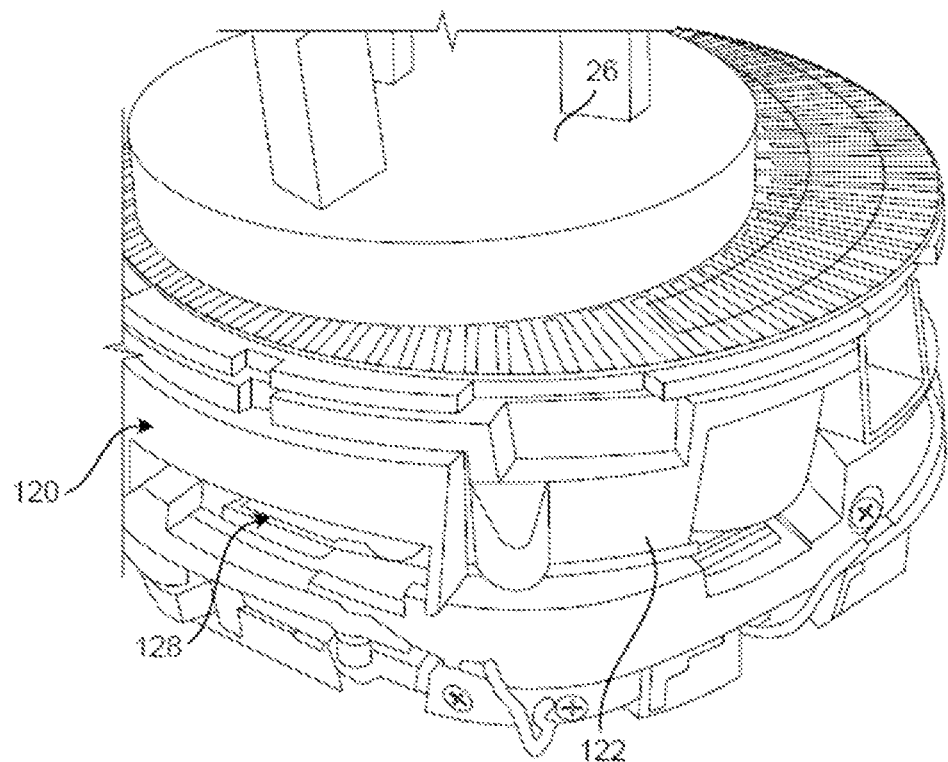

In one embodiment, the compact electronic device 10 may include an outer plastic housing (e.g., comprising the top cover 12 and base 18). The outer plastic housing can be used for safety around the AC primary-side power components to reduce or eliminate creepage. The compact electronic device 10 may also include an inner casing (e.g., as shown in FIGS. 13A-13C), which may be arranged inside the outer plastic housing. The inner casing may have a high-voltage section and a low-voltage section. The high-voltage section, for instance, may be configured to support one or more high-voltage electrical components and the low-voltage section may be configured to support one or more low-voltage electrical components.

Also, in these embodiments, the compact electronic device 10 may include a single fan or single fan module (e.g., fan module 58), which may be configured to draw air from outside the outer plastic housing, move the air through the high-voltage section and low-voltage section, and exhaust the air through one or more exhaust vents (e.g., 30, 34) in the outer plastic housing. More particularly, the inner casing may be configured to isolate the one or more high-voltage electrical components from metal portions of the low-voltage section by at least a certain separation to meet clearance and creepage safety standards. For example, a gap between any metal in the high-voltage and low-voltage regions may need to meet creepage requirements (e.g., at least 6.5 mm).

However, certain modifications can be made to conventional construction of compact electronic devices to allow heat to be dissipated, even with the high-voltage or high-power components that may normally be trapped in an area with little ventilation. Even with the high power (e.g., 24 W) of Wi-Fi 6 versus the conventional power (e.g., 15 W) of Wi-Fi 5, the embodiments described in the present disclosure are configured to handle the issue with regard to a need to dissipate extra heat, even without the need to run the fan at a higher speed, since higher fan speeds can be more disruptive to users.

FIGS. 13A-13C show photographs of various bottom views of internal portions of the compact electronic device 10, where these internal portions are shown upside-down with respect to the orientation of FIG. 1. FIG. 13A shows a right side of the internal portions; FIG. 13B shows a left side of the internal portions; and FIG. 13C shows a back side of the internal portions. As illustrated, FIGS. 13A-13C show a plastic chamber 120, which includes at least the bottom portion 26 described above. Also, these pictures show an inner casing 122, which may include a metallic structure and used as a heat sink. In some embodiments, the plastic chamber 120 may be arranged inside the inner casing 122, which in turn is mounted inside the outer plastic housing (e.g., comprising the top cover 12 and base 18).

The plastic chamber 120 includes a window 124 (FIG. 13A) on a right side thereof, whereby the window 124 is configured to protrude out through an opening in the inner casing 122. Also, the plastic chamber 120 includes a window 126 (FIG. 13B) on a left side thereof, whereby the window 126 is also configured to protrude out through another opening in the inner casing 122. The window 124 includes a lip 125 and the window 126 includes a lip 127. The lips 125, 127 are configured to increase the surface distance (to meet creepage requirements) and reduce electromagnetic interference. The windows 124, 126 (or portals) are internal and are normally not seen from a user's viewpoint.

The fan module 58 is configured to draw exterior air from outside the outer plastic housing into the interior of the outer plastic housing (e.g., through vents 32) and into the plastic chamber 120 through the two windows 124, 126. Air passes through a first layer within the plastic chamber 120, which is configured to support high-voltage electronic components, and exits first layer through an air passage 128 (FIG. 13C) that connects the first layer to a second layer. The second layer, for example, may be configured to support low-voltage electronic components. The air passage 128 is formed by window of the plastic chamber 120. The window of the air passage 128 may include portions of the plastic chamber 120 and may be configured to reduce electromagnetic interference.

Figure 14:
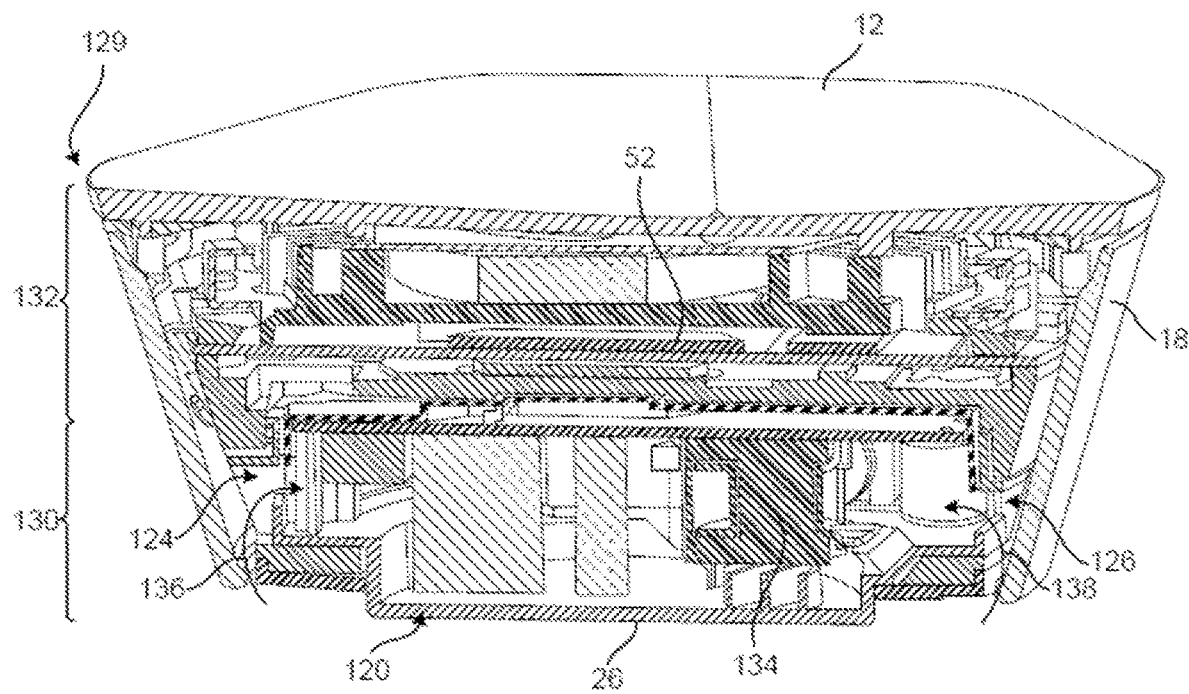
FIG. 14 is a cross-sectional side view of the compact electronic device from a back side perspective view.

FIG. 14 is a cross-sectional side view of the compact electronic device 10 from a back side perspective. An outer plastic housing 129 has include a top cover (e.g., top cover 12) and a base (e.g., base 18). The interior of the compact electronic device 10 (e.g., inside the outer plastic housing 12) includes a high-voltage section 130 and a low-voltage section 132. For example, the high-voltage section 130 is configured to house high-voltage AC components. The electrical plug 24 is configured to receive 120V AC (or other suitable voltage) from an electrical outlet and apply the supply voltage to the high-voltage AC components within the high-voltage section 130. A transformer 134 may be used to convert the high voltage to a small voltage (e.g., 3.5V) to be applied to a CPU and other low-voltage components that may be housed in the low-voltage section 132.

Also, the air flow patterns can be seen in FIG. 14. For example, air that is drawn into the outer plastic housing through vents 32 may follow a path 136 through the window 124 on the right side of the plastic chamber 120 and a path 138 through the window 126 on the left side of the plastic chamber 120. In this way, air can be drawn into the high-voltage section 130 to cool the high-voltage AC components.

Figure 15:
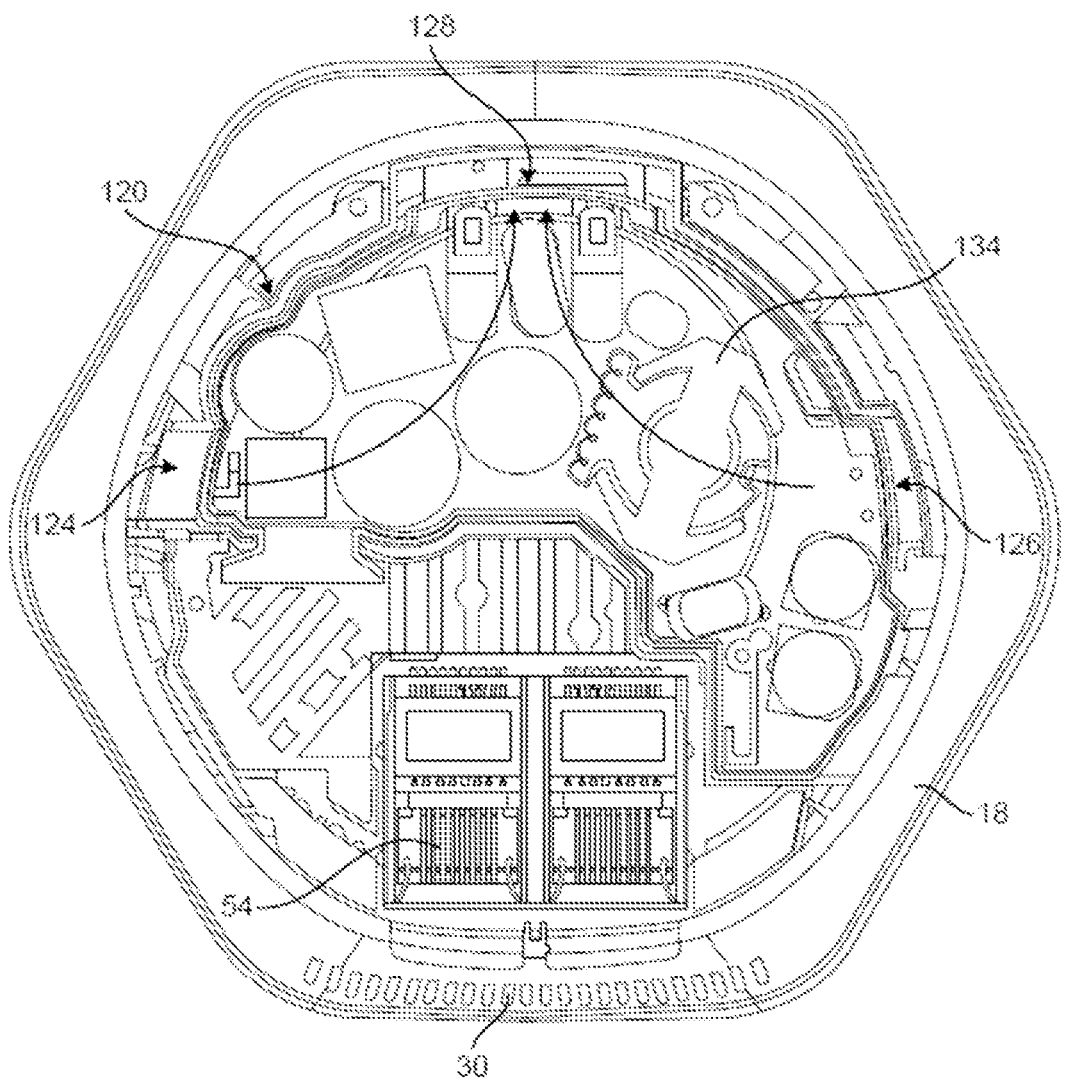
FIG. 15 is a cross-sectional bottom view of a high-voltage section of the compact electronic device.

FIG. 15 is a cross-sectional bottom view of the high-voltage section 130 of the compact electronic device 10. Air drawn through the window 124 and air drawn through the window 126 can flow around the high-voltage components and exit through the air passage 128, which leads to the low-voltage section 132.

Figure 16:
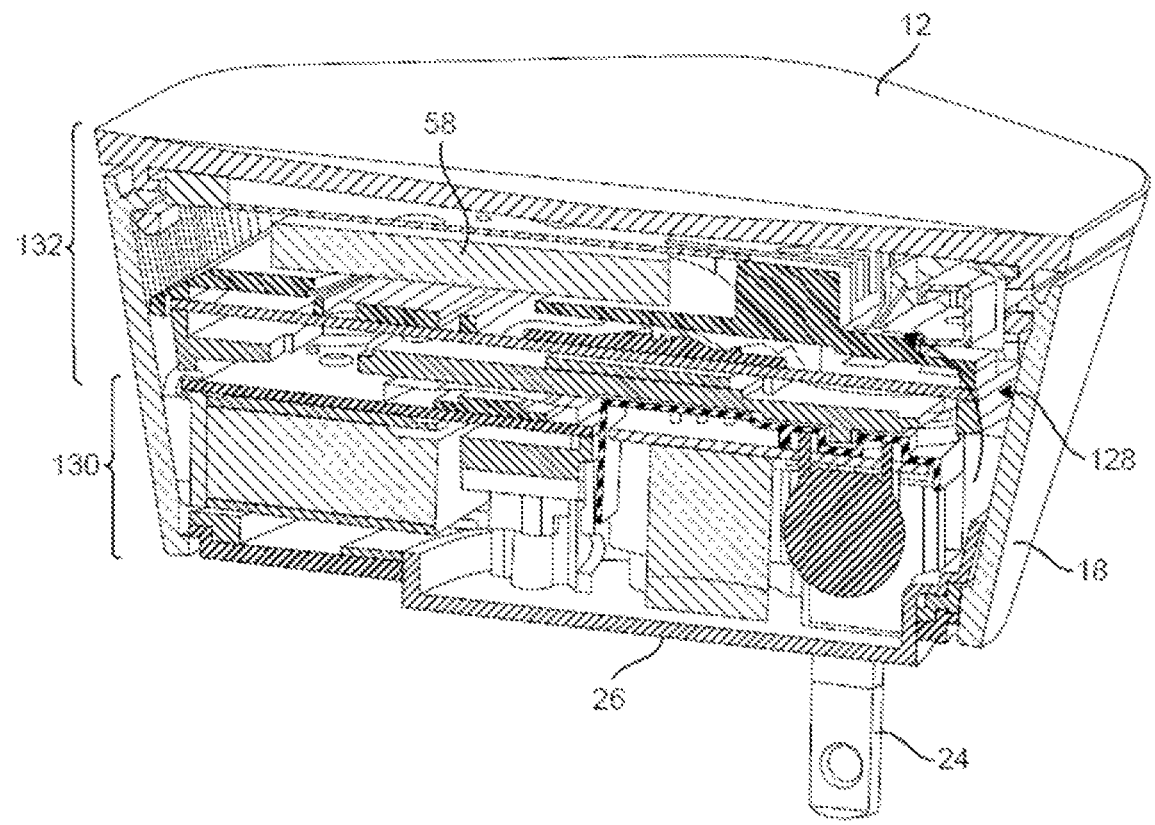
FIG. 16 is a cross-sectional side view of the compact electronic device from a right side perspective view.

FIG. 16 is a cross-sectional side view of the compact electronic device 10 from a right side perspective view. The air from the high-voltage section 130 (e.g., lower section) flows through the air passage 128 into the low-voltage section 132 (e.g., higher section).

The low-voltage section 132 is configured to support at least a fan module 58 that includes at least the single fan used for drawing air into the interior and forcing air out. The high-voltage section 130 is configured to support at least the transformer 134, which may be electrically connected to the AC electrical plug 24. The AC electrical plug 24 may be configured to be connected to an AC electrical outlet (not shown) that provides AC power to the compact electronic device and physically keeps the compact electronic device substantially in place when plugged into the AC electrical outlet.

The high-voltage section 130 may include portions of the plastic chamber 120 within the inner casing 122 for protecting the high-voltage electrical components from electromagnetic interference. The plastic chamber 120, as shown, may include one or more side windows 124, 126 allowing air to flow from bottom vents (e.g., vents 32) in the outer plastic housing 129, through one or more openings in the inner casing 122, through the one or more side windows 124, 126 into the plastic chamber 120, and through the air passage 128 that connects the high-voltage section 130 to the low-voltage section 132. Each of the one or more side windows 124, 126 may include a lip 125, 127, respectively, which is configured to increase electromagnetic separation between the high-voltage section 130 and the low-voltage section 132.

Figure 17:
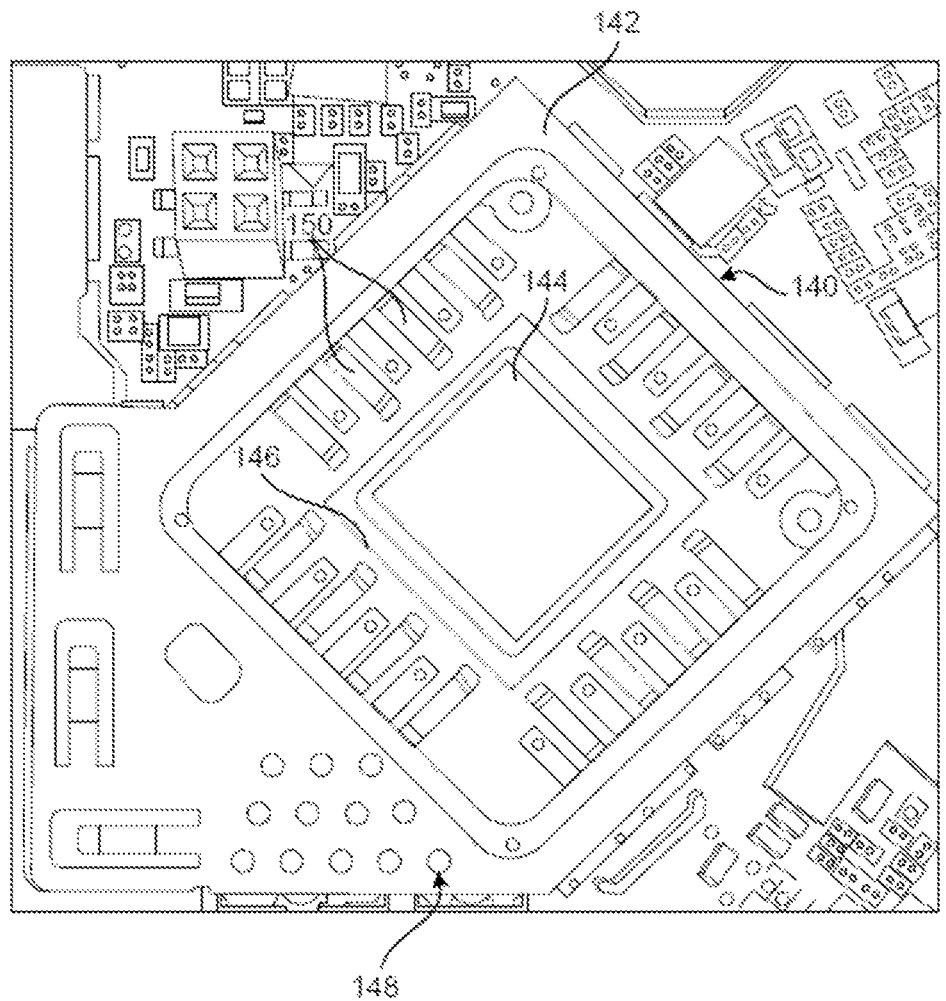
FIG. 17 is a diagram showing a top view of a CPU module mounted on a PCB.
Figure 18:
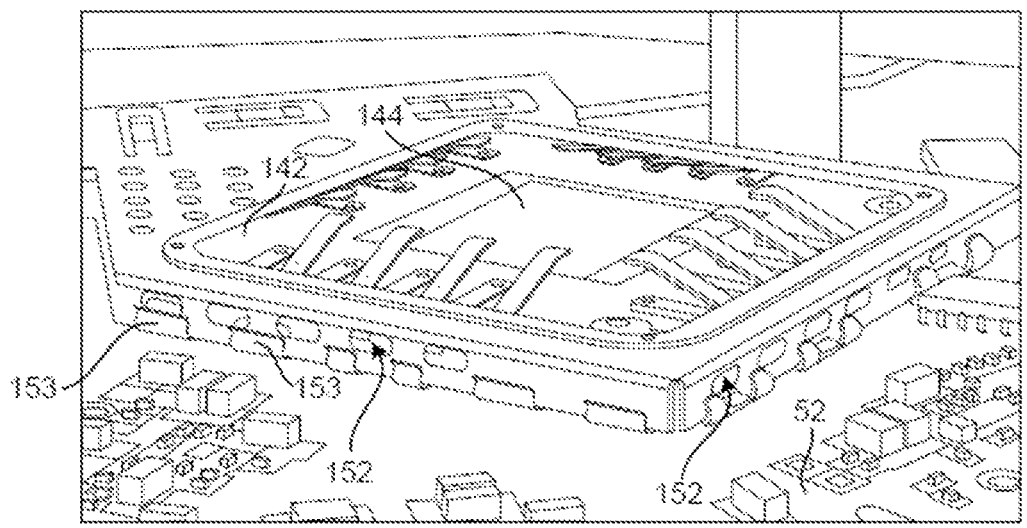
FIG. 18 is a diagram showing the CPU module mounted on the PCB.

FIG. 17 is a picture showing a top view of a CPU module 140 mounted on a PCB 52 and FIG. 18 is a perspective view of the CPU module 140. For example, the CPU module 140 and PCB 52 may be positioned in the low-voltage section 132 and are configured to receive an airflow for cooling down the low-voltage electrical components. The CPU module 140 includes a conductive shield 142 (or shield can) configured for providing electromagnetic compatibility. A CPU die 144 is positioned in the CPU module 140. In the embodiments described herein, an opening 146 is formed in the top of the conductive shield 142 that exposes the CPU die 144 and provide the advantage of allowing the CPU die 144 to cool down more efficiently. In this respect, the opening 146 allow a greater amount of airflow for cooling the CPU die 144. It may be noted that in conventional designs, a CPU module 140 does not normally include an opening (such as the opening 146), but remains closed, thereby covering the chipset and preventing airflow.

Also, for the purpose of airflow assistance, the CPU module 140 may include a plurality of holes 148 in the top of the conductive shield 142. The CPU module 140 shown in FIG. 17 is also configured to provide heat sink features for carrying heat away from the CPU die 144. In particular, the CPU module 140 further includes fingers 150 (or springs) around the opening 146. For example, some embodiments may include four fingers 150 at each side of the opening 146. One end of each of the fingers 150 is connected (e.g., soldered, laser welded, etc.) to the top surface of the conductive shield 142. The other end of each of the fingers 150 (e.g., as shown in FIG. 18) extends at an angle from the conductive shield 142 and includes contact portions that can be connected to a heat sink, such as the heat sink described with respect to FIG. 19.

Furthermore, as shown in FIG. 18, side portions of the conductive shield 142 may include side openings 152 for allowing airflow at the level of the CPU die 144 itself. Also, the conductive shield 142 may be created from a layer of material (e.g., metal), where the opening 146 is cut out, holes 148 are drilled, the side openings 152 are drilled, and side edges are folded down. The side edges, during construction, can be inserted into spring clips 153 connected to the PCB 52. In this way, the CPU module 140 can be inserted onto the PCB 52 (using spring clips 153) without soldering.

Figure 19:
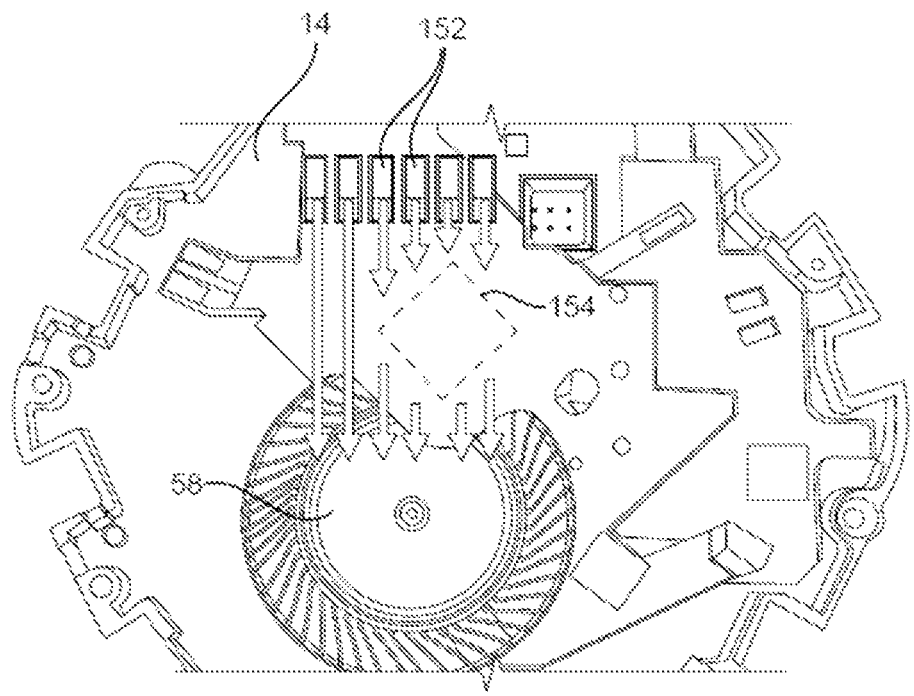
FIG. 19 is a diagram showing a bottom view of an underside of a heat sink configured for covering the CPU module shown in FIGS. 17 and 18.

FIG. 19 is a picture showing a bottom view of an underside of a heat sink 14 (e.g., aluminum heat spreader), which may be configured to include features similar to the heat sink 14 of FIG. 5 or other suitable heat sink devices. In this embodiment, the heat sink 14 is configured for covering the CPU module 140 shown in FIGS. 17 and 18 and dissipating heat away from the CPU die 144. Also, the heat sink 14 is configured to create an EMI shield and grounding effects. The heat sink 14 may include a contact area 154, which may be configured to contact the fingers 150 of the CPU module 140 as well as the CPU die, there is a thermal pad in between CPU die and contact area 154, so the heat can be transferred to the heat sink 14, providing very efficient thermal conduction. The finger 150 may contact the heat sink 14 to provide the EMI shield benefits and grounding effect for the CPU module 140.

Also, the heat sink 14 in this embodiment includes openings 156 configured in alignment with an airflow through the interior of the outer plastic housing 129 to allow air to flow toward and around the CPU module 140 for cooling the CPU die 144. The fan module 58 may be positioned on the heat sink 14 for drawing air in the direction of the arrows (and as described with respect to FIGS. 13-18) and pushing the airflow toward the vents 30 and front-oriented air gap 34.

Therefore, the compact electronic device 10, according to various embodiments, may further be configured whereby the low-voltage section 132 is configured to support at least the PCB 52 and the CPU module 140 that is mounted on the PCB 52. The CPU module 140 may include at least the CPU die 144 and the conductive shield 142. The conductive shield 142 may have the opening 146 in a top portion thereof. The opening 146 may be substantially square and may have dimensions (e.g., length and width) that are larger than the dimensions (e.g., length and width) of the CPU die 144 itself. The opening 146 allows air to flow into the CPU module 140 and around the CPU die 144. The CPU module 140 may further include a plurality of fingers 150 extending at an angle from the top surface of the conductive shield 142, where a spring end of the fingers 150 may be configured to contact the heat sink 14 that covers the CPU module 140. Also, the low-voltage section 132 may further include spring clips 153 attached to a top surface of the PCB 52 and the conductive shield 142 may include downward-directed sides (e.g., edges extending downward from the top portion thereof) to give the CPU module 140 a relatively low profile. The edges of the conductive shield 142 may be supported by the spring clips 153. Also, the edges include relatively large side openings 152 therein to allow greater air flow around the CPU die 144 within the CPU module 140.

Figure 20:
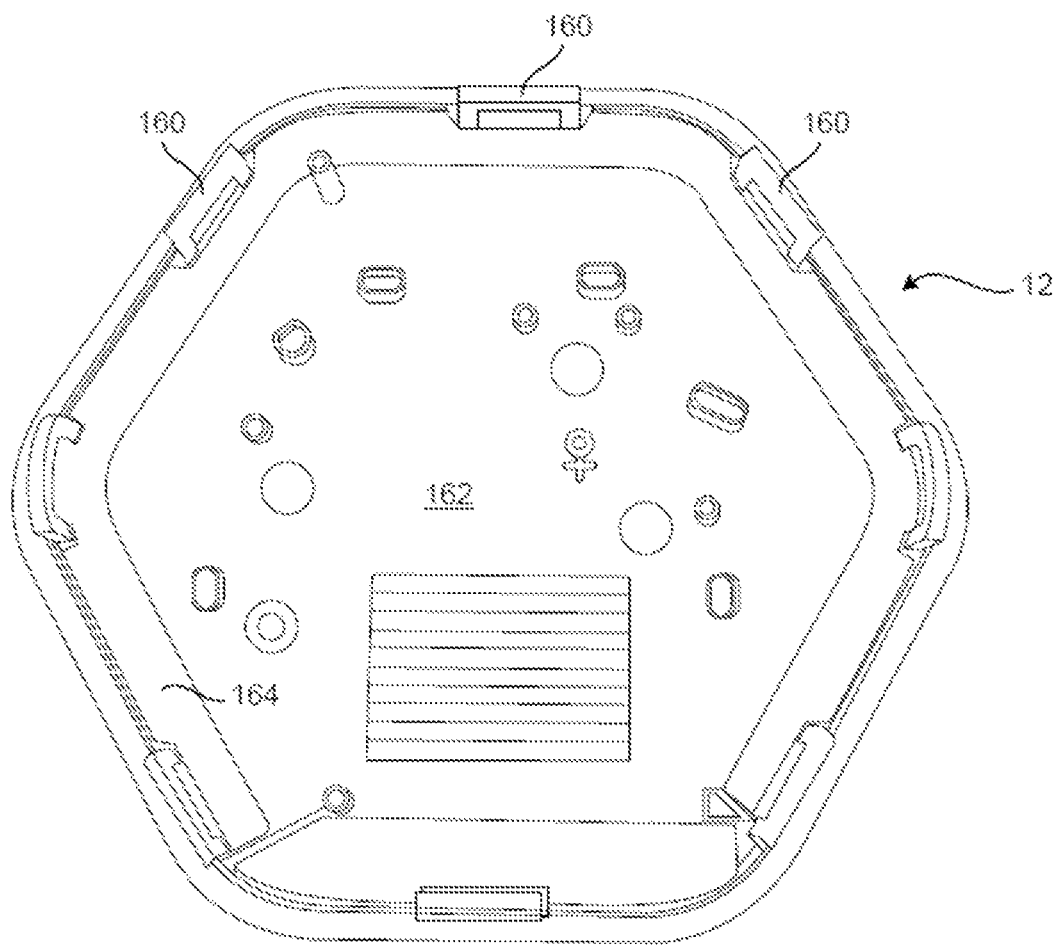
FIG. 20 is a diagram showing an underside of the top cover of the compact electronic device.

FIG. 20 is a diagram showing an underside of the top cover 12 of the compact electronic device 10 or other suitable cover. The top cover 12 includes connection elements 160 extending from the underside surface 162 thereof. The connection elements 160 are configured to mate with corresponding connection elements on the base 18 for holding the top cover 12 in place on the base 18, thereby forming the outer plastic housing 129 described above. The connection elements 160 (and corresponding elements on the base 18) may be configured to be removable if a technician or user wish to open up the compact electronic device 10.

Figure 21:
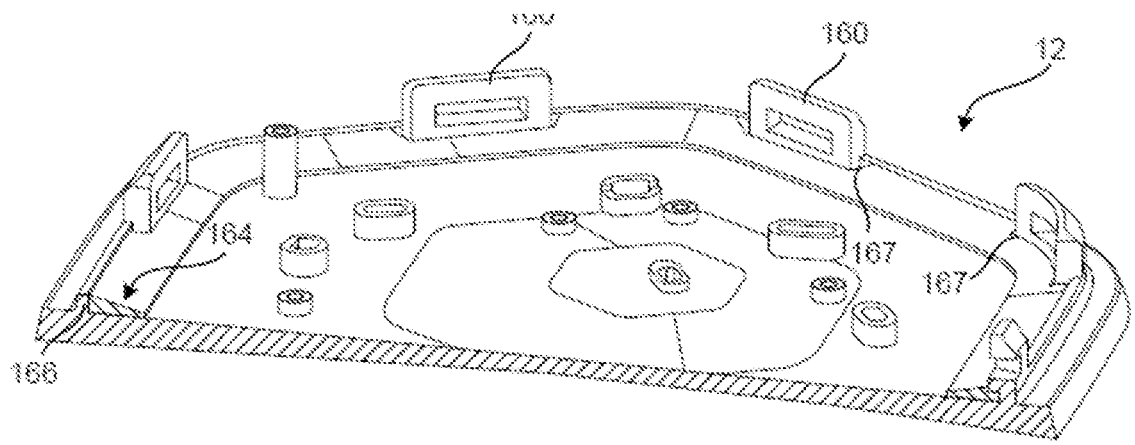
FIG. 21 is a cross-sectional perspective view of the underside of the top cover.

Furthermore, in the embodiments illustrated in FIGS. 20 and 21, the top cover 12 may further include an insert 164. The insert 164 may be a separate piece that is manufactured separately from the top cover 12. For example, the top cover 12 and insert 164 may be manufactured separately in two different injection molding processes. The purpose of manufacturing the top cover 12 and insert 164 separately may be that the thickness of the top cover 12 (i.e., where the insert 164 would be located) may cause this area to be sunken, which may be unsightly to the user.

The insert 164 can be installed as shown in FIG. 20 and is configured to provide a more efficient airflow pattern, minimize turbulence, reduce air resistance, smooth the air paths around sharp edges, etc. The insert 164 may be designed based on aerodynamic principles to allow greater airflow through the interior of the device. In particular, the insert 164 includes a slanted (e.g., sloped, curved) surface that prevents air from circulating in eddies or creating other kinds of turbulence, such as at an inside corners where two perpendicular pieces join. The slanted surface may be a straight surface or a curved (e.g., concave) surface. Also, these improvements can allow enhanced airflow without the need of increasing the fan speed.

FIG. 21 is a cross-sectional perspective view of the underside of the top cover 12 with the insert 164 positioned thereon. The insert 164 may be attached to the underside surface 162 of the top cover 12 using two-sided tape, which can be a quicker manufacturing process as opposed to applying glue that requires some drying time to effectively set. As shown in FIG. 21, the underside surface 162 of the top cover 12 includes a wall 166 that runs around the periphery thereof. A side edge of the insert 164 may be positioned against the wall 166. The remaining side of the insert 164 may have a sloped surface to round the edge around the wall and promote better airflow. Also, air that might normally circulate in eddy patterns in the corner formed by the wall 166 and the underside surface 162 of the top cover 12 can be blocked by the insert 164. Furthermore, gaps 167 may be formed between the underside surface 162 and a jutting portion of the connection elements 160. In this case, the insert 164 may be formed to fill these gaps 167 and may be installed such that corresponding portion of the insert 164 are placed in the gaps 167.

Figure 22:
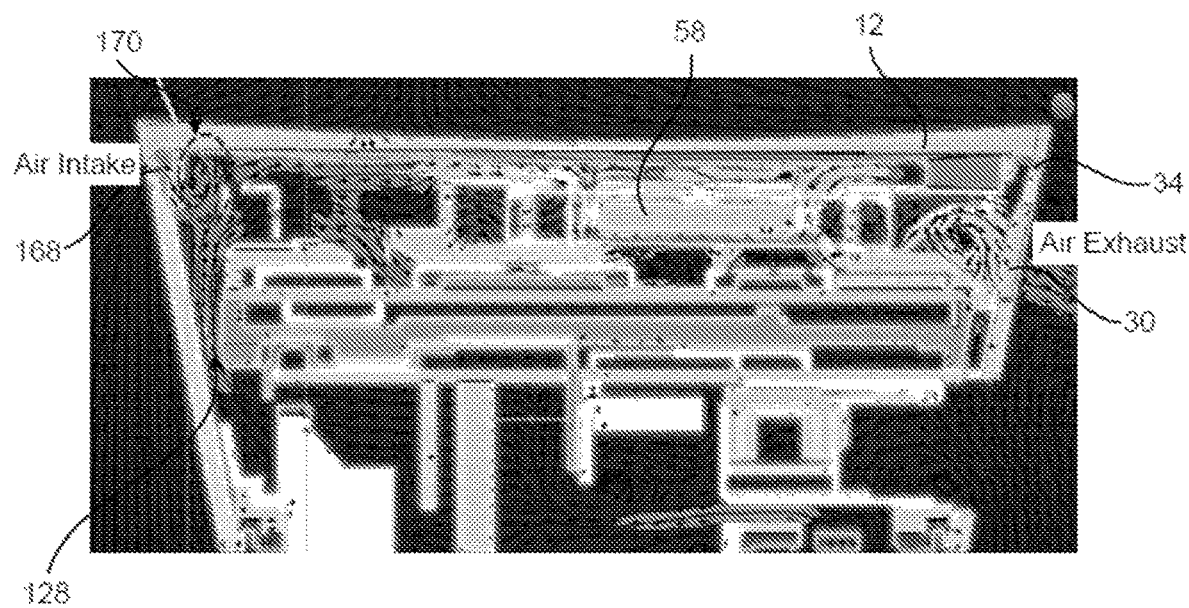
FIG. 22 is a cross-sectional side view of the interior of the compact electronic device showing air flow patterns throughout.
Figure 23:
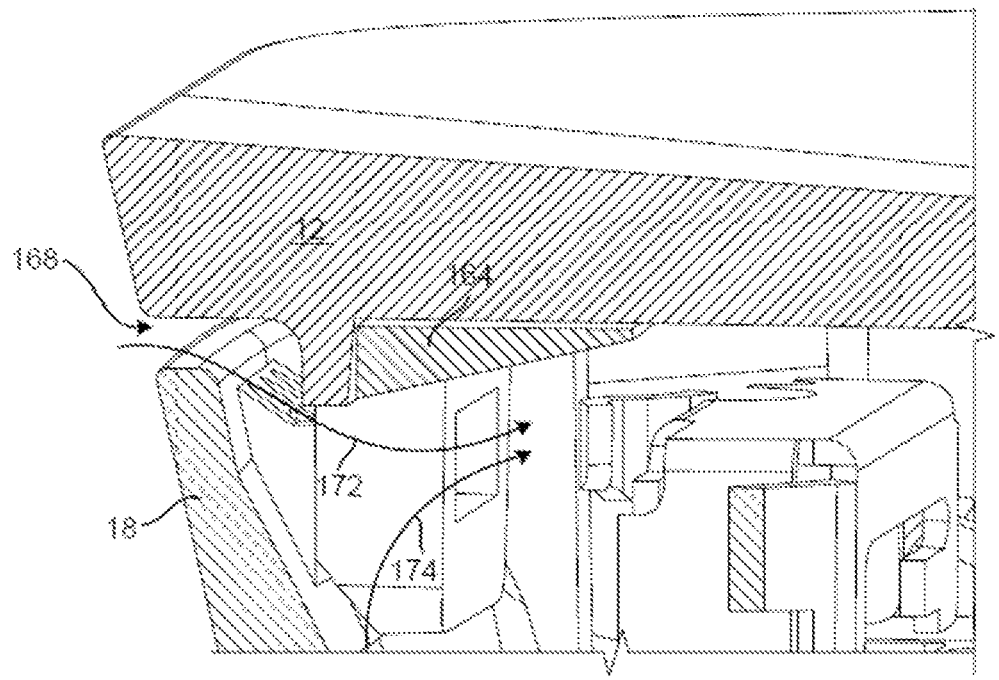
FIG. 23 is a cross-sectional side view showing a close-up section an insert used for reducing turbulence or eddies in the air flow through the compact electronic device.

FIG. 22 is a cross-sectional side view of the interior of the compact electronic device 10 showing air flow patterns throughout. FIG. 22 shows the interior from a left-side perspective. Slit vents 168 may be formed between the top cover 12 and the base 18 when the two pieces are connected together using the connection elements 160. FIG. 23 is a cross-sectional side view showing a close-up of the slit vents 168. Also, the insert 164 is installed on the top cover 12 for reducing turbulence or eddies 170 in the air flow through the compact electronic device 10.

The slit vents 168 (e.g., similar to the air gaps 34 shown in FIG. 1) may be formed at the back (e.g., at or near side 46) of the compact electronic device 10 where the air intake is indicated. FIG. 22 shows the compact electronic device 10 without the insert 164. Thus, as a result of the configuration of the wall 166 extending downward at the slit vent 168, air will tend to create turbulence or eddies 170 around the corner of the wall 166. Thus, by installing the insert 164 (as shown in FIG. 23), the air is allowed to flow more efficiently (without eddies, turbulence, etc.).

A first airstream 172 is directed through the slit vent 168, being drawn by the fan module 58, and is exhausted out the vents 30 (indicated as the air exhaust) at the front of the compact electronic device 10. A second airstream 174 is directed through the air passage 128 (as described with respect to FIGS. 13-16), being drawn by the fan module 58, joins the first airstream 172, and is exhausted out the vents 30.

In the embodiments of the present disclosure, the top cover 12 may be formed in an injection molding process. The portions of the insert 164 are typically not manufactured with the top cover 12 since the extra thickness of the top cover 12 at the insert 164 may cause a sunken area during the injection molding process. Therefore, it may be preferred to create the insert 164 separately and connect it to the top cover 12 in a separate production step. Nevertheless, the wall 166 may be created with a small inclined or curved surface next to the slit vent 168, which can help to direct airflow appropriately with less resistance. In some embodiments, however, the inclined or curved surface may be replaced with another separately manufactured insert. Also, multiple inserts may be arranged in any interior corner or other areas where air may tend to stall, circulate onto itself, create eddies (e.g., eddies 170), create turbulence, etc. anywhere within the interior of the compact electronic device 10.

Therefore, according to some embodiments, the outer plastic housing 129 may further include the top cover 12 removably attached to the base portion 18. When the top cover 12 is attached to the base portion 18, the outer plastic housing 129 forms the slit vents 168 having a predetermined gap between an underside surface of the top cover 12 and an upper edge of the base portion 18. The top cover 12 may include a wall (e.g., wall 166) that extends downward from the underside surface 162, whereby the wall 166 may have a height that is greater than this predetermined gap (or width of the slit vents 168). Thus, the wall 166 can thereby hide the inner casing 122 (and other internal elements) from a viewpoint outside the outer plastic housing 129. The slit vents 168 allow air to flow into the interior of the outer plastic housing 129.

The insert 164 may have a top surface, a side surface, and a slanted bottom surface. In some embodiments, the slanted bottom surface may have a straight slope, but in other embodiments, the slanted bottom surface may have a curved (e.g., concave) profile. The top surface of the insert 164 may be attached to the underside surface 162 of the top cover 12. The side surface of the insert 164 may be arranged next to the wall 166. Also, the slanted bottom surface of the insert 164 may be configured to direct air flow away from the wall 166 to reduce turbulence and eddies. Portions of the insert 164 may be placed in the gaps 167 formed by the plurality of connection elements 160 configured to connect the top cover 12 to the base portion 18. Furthermore, the insert 164 may be attached to the underside surface 162 of the top cover 12 using two-sided tape. The base portion 18 may include a plurality of sides 40, 42, 44, 46, 48, 50 and a bottom section 26, 32, wherein the slit vents 168 may include multiple intake air vents (e.g., at sides 42, 44, 46, 48, 50) and one exhaust air vent (e.g., at side 40), and wherein the bottom section includes one or more intake air vents 32.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A compact electronic device comprising:
   an outer plastic housing;
   an inner casing arranged inside the outer plastic housing, the inner casing having a high-voltage section and a low-voltage section, the high-voltage section configured to support one or more high-voltage electrical components, the low-voltage section configured to support one or more low-voltage electrical components; and
   a single fan configured to draw air from outside the outer plastic housing, move the air through the high-voltage section and low-voltage section, and exhaust the air through one or more exhaust vents in the outer plastic housing;
   wherein the inner casing is configured to isolate the one or more high-voltage electrical components from metal portions of the low-voltage section by at least a certain separation to meet clearance and creepage safety standards.

2. The compact electronic device of claim 1, wherein the low-voltage section is configured to support at least a fan module that includes at least the single fan, and wherein the high-voltage section is configured to support an electrical plug that can be inserted into an AC outlet.

3. The compact electronic device of claim 2, wherein the AC electrical plug is configured to be connected to an AC electrical outlet that provides AC power to the compact electronic device and physically keeps the compact electronic device substantially in place when plugged into the AC electrical outlet.

4. The compact electronic device of claim 2, wherein the high-voltage section includes a plastic chamber within the inner casing for protecting the one or more high-voltage electrical components from electromagnetic interference, wherein the plastic chamber includes one or more side windows allowing air to flow from bottom vents in the outer plastic housing, through one or more openings in the inner casing, through the one or more side windows into the plastic chamber, and through an air passage that connects the high-voltage section to the low-voltage section.

5. The compact electronic device of claim 4, wherein each of the one or more side windows includes a lip configured to increase electromagnetic separation between the high-voltage section and the low-voltage section.

6. The compact electronic device of claim 1, wherein the low-voltage section is configured to support at least a PCB and a CPU module mounted on the PCB, the CPU module including at least a CPU die and a conductive shield, the conductive shield having an opening in a top portion thereof, the opening having dimensions that are larger than the CPU die itself, the opening allowing air to flow into the CPU module and around the CPU die.

7. The compact electronic device of claim 6, wherein the CPU module further includes a plurality of fingers extending at an angle from the top surface of the conductive shield, and wherein a spring end of the fingers is configured to contact a heat sink that covers the CPU module.

8. The compact electronic device of claim 6, wherein the low-voltage section further includes spring clips attached to a top surface of the PCB, wherein the conductive shield includes edges extending downward from the top portion thereof to give the CPU module a low profile, wherein the edges are configured to be supported by the spring clips, and wherein the edges include relatively large side openings therein to allow greater air flow around the CPU die within the CPU module.

9. The compact electronic device of claim 1, wherein the outer plastic housing includes a top cover removably attached to a base portion, whereby, when the top cover is attached to the base portion, the outer plastic housing forms slit vents having a predetermined gap between an underside surface of the top cover and an upper edge of the base portion, wherein the top cover includes a wall that extends downward from the underside surface, the wall having a height greater than the predetermined gap to thereby hide the inner casing from a viewpoint outside the outer plastic housing, and wherein the slit vents allow air to flow into an interior of the outer plastic housing.

10. The compact electronic device of claim 9, further comprising an insert having a top surface, side surface, and a slanted bottom surface, the top surface of the insert configured to be attached to the underside surface of the top cover, the side surface configured to be arranged next to the wall, and the slanted bottom surface configured to direct air flow away from the wall to reduce turbulence and eddies.

11. The compact electronic device of claim 10, wherein portions of the insert are configured to be placed in gaps formed by a plurality of connection elements configured to connect the top cover to the base portion.

12. The compact electronic device of claim 10, wherein the insert is attached to the underside surface of the top cover using two-sided tape.

13. The compact electronic device of claim 9, wherein the base portion includes a plurality of sides and a bottom section, wherein the slit vents include multiple intake air vents and one exhaust air vent, and wherein the bottom section includes one or more intake air vents.

14. The compact electronic device of claim 9, wherein the inner surfaces of the outer casing are substantially smoothed to reduce turbulence in airflow.

15. The compact electronic device of claim 9, wherein the wall that extends from the top cover is rounded or smoothed to reduce turbulence in the airflow in the slit vents.

16. A wireless Access Point (AP) comprising:
an outer plastic housing;
an inner casing arranged inside the outer plastic housing, the inner casing having a high-voltage section and a low-voltage section, the high-voltage section configured to support one or more high-voltage electrical components, the low-voltage section configured to support one or more low-voltage electrical components; and
a single fan configured to draw air from outside the outer plastic housing, move the air through the high-voltage section and low-voltage section, and exhaust the air through one or more exhaust vents in the outer plastic housing;
wherein the inner casing is configured to isolate the one or more high-voltage electrical components from metal portions of the low-voltage section by at least a certain separation to meet clearance and creepage safety standards.

17. The wireless AP of claim 16, wherein the low-voltage section is configured to support at least a fan module that includes at least the single fan, and wherein the high-voltage section is configured to support at least a transformer electrically connected to an AC electrical plug.

18. The wireless AP of claim 17, wherein the high-voltage section includes a plastic chamber within the inner casing for protecting the one or more high-voltage electrical components from electromagnetic interference, wherein the plastic chamber includes one or more side windows allowing air to flow from bottom vents in the outer plastic housing, through one or more openings in the inner casing, through the one or more side windows into the plastic chamber, and through an air passage that connects the high-voltage section to the low-voltage section.

19. The wireless AP of claim 16, wherein the low-voltage section is configured to support at least a PCB and a CPU module mounted on the PCB, the CPU module including at least a CPU die and a conductive shield, the conductive shield having an opening in a top portion thereof, the opening having dimensions that are larger than the CPU die itself, the opening allowing air to flow into the CPU module and around the CPU die.

20. The wireless AP of claim 19, wherein the CPU module further includes a plurality of fingers extending at an angle from the top surface of the conductive shield, and wherein a spring end of the fingers is configured to contact a heat sink that covers the CPU module.

* * * * *